(12) United States Patent
Sugiyama et al.

(10) Patent No.: US 10,939,562 B2
(45) Date of Patent: Mar. 2, 2021

(54) MULTILAYER BOARD AND MANUFACTURING METHOD OF THE SAME

(71) Applicant: TAIYO YUDEN CO., LTD., Tokyo (JP)

(72) Inventors: Yuichi Sugiyama, Tokyo (JP); Masashi Miyazaki, Tokyo (JP); Yutaka Hata, Tokyo (JP); Hiroyuki Kobayashi, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 16/809,122

(22) Filed: Mar. 4, 2020

(65) Prior Publication Data

US 2020/0315032 A1  Oct. 1, 2020

(30) Foreign Application Priority Data

Mar. 26, 2019 (JP) .............................. JP2019-059365
Mar. 26, 2019 (JP) .............................. JP2019-059388

(51) Int. Cl.
*H05K 3/46* (2006.01)
*H05K 3/44* (2006.01)

(52) U.S. Cl.
CPC ........... *H05K 3/4608* (2013.01); *H05K 3/445* (2013.01); *H05K 3/4626* (2013.01)

(58) Field of Classification Search
CPC ..... H05K 3/4608; H05K 3/445; H05K 3/4626

USPC ........................................................ 174/262
See application file for complete search history.

(56) References Cited

U.S. PATENT DOCUMENTS

| | | | |
|---|---|---|---|
| 2006/0255440 A1 | 11/2006 | Miyazaki et al. | ............ 257/679 |
| 2009/0084596 A1 | 4/2009 | Inoue et al. | ................... 174/261 |
| 2013/0043584 A1 | 2/2013 | Kwon et al. | ................... 257/737 |
| 2016/0293537 A1 | 10/2016 | Sugiyama et al. | |

FOREIGN PATENT DOCUMENTS

| | | |
|---|---|---|
| JP | 2002-26193 A | 1/2002 |
| JP | 2003-347741 A | 12/2003 |
| JP | 2008-218521 A | 9/2008 |
| JP | 2009-302663 A | 12/2009 |
| JP | 2013-42136 A | 2/2013 |
| JP | 2013-192475 A | 11/2016 |

*Primary Examiner* — Tremesha S Willis
(74) *Attorney, Agent, or Firm* — Stein IP, LLC

(57) ABSTRACT

A manufacturing method of a multilayer board includes: forming a metal core layer including a main body, an island portion, and four connection portions, the island portion having a substantially rectangle shape and being located in an opening formed in the main body, the opening having a substantially rectangle shape, the four connection portions connecting side surfaces of four corners of the island portion or side surfaces of vicinities of the four corners of the island portion to a side surface of the main body; forming a first insulating layer on the metal core layer and in the opening; and forming, in the first insulating layer, a hole reaching each of the four connection portions and removing at least a part of each of the four connection portions through the hole to electrically separate the main body and the island portion from each other

11 Claims, 21 Drawing Sheets

US 10,939,562 B2

MULTILAYER BOARD AND MANUFACTURING METHOD OF THE SAME

CROSS-REFERENCE TO RELATED APPLICATION

This application is based upon and claims the benefits of priorities of the prior Japanese Patent Application No. 2019-059388, filed on Mar. 26, 2019, and the prior Japanese Patent Application No. 2019-059365, filed on Mar. 26, 2019, the entire contents of which are incorporated herein by reference.

FIELD

A certain aspect of the embodiments relates to a multilayer board and a manufacturing method of the same.

BACKGROUND

There has been known a multilayer board in which metal layers including a metal core layer and insulating layers are stacked as disclosed in, for example, Japanese Patent Application Publication No. 2009-302563 (hereinafter, referred to as Patent Document 1).

SUMMARY OF THE INVENTION

According to a first aspect of the embodiments, there is provided a manufacturing method of a multilayer board including: forming a metal core layer including a main body, an island portion, and four connection portions, the island portion having a substantially rectangle shape and being located in an opening formed in the main body, the opening having a substantially rectangle shape, the four connection portions connecting side surfaces of four corners of the island portion or side surfaces of vicinities of the four corners of the island portion to a side surface of the main body; forming a first insulating layer on the metal core layer and in the opening; and forming, in the first insulating layer, a hole reaching each of the four connection portions and removing at least a part of each of the four connection portions through the hole to electrically separate the main body and the island portion from each other.

According to a second aspect of the embodiments, there is provided a multilayer board including: a metal core layer including a main body and an island portion, the island portion having a substantially rectangle shape, being located in an opening, and being electrically separated from the main body, the opening having a substantially rectangle shape and being formed in the main body; a first insulating layer located on the metal core layer and in the opening, the first insulating layer having four holes formed in four regions of the first insulating layer, a side surface of the main body and a side surface of the island portion being exposed to the four holes, the four holes reaching a surface, of the first insulating layer, the four regions being located between four corners of the island portion or vicinities of the four corners of the island portion and four vertices of the opening or vicinities of the four vertices of the opening; and a second insulating layer filling the four holes.

According to a third aspect of the embodiments, there is provided a multilayer board including: a metal core layer including a main body and an island portion, the island portion having a substantially rectangle shape, being located in an opening, and being electrically separated from the main body, the opening having a substantially rectangle shape and being located from a front surface to a back surface of the main body; protrusion portions located on the metal core layer and in the opening, the protrusion portions being traces of connection portions connecting the main body and the island portion, the protrusion portions being located in four regions between four corners of the island portion or vicinities of the four corners and four corners of the opening or vicinities of the four corners of the opening; and a first insulating layer filling a region defined by a side surface of the main body, a side surface of the island portion, and a side surface of the protrusion portion.

DETAILED DESCRIPTION

In a multilayer board in which metal layers including a metal core layer and insulating layers are stacked, an opening may be provided in the main body of the core layer, and an island portion of the core layer may be provided in the opening. However, it is difficult to provide the island portion in a desired location in the opening.

Hereinafter, a description will be given of embodiments with reference to the accompanying drawings.

First Embodiment

Figure 1A:
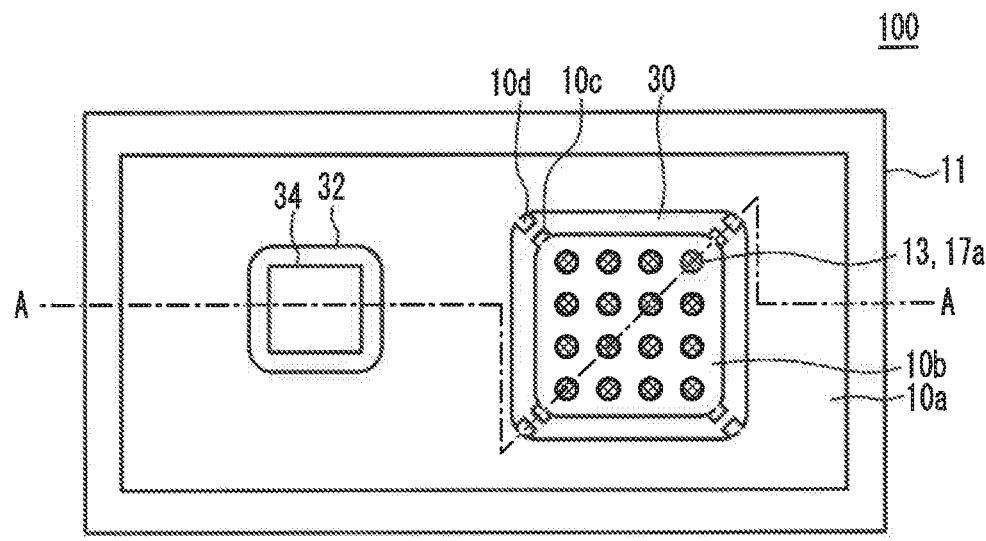
FIG. 1A is a plan view of a multilayer board in accordance with a first embodiment.
Figure 1B:
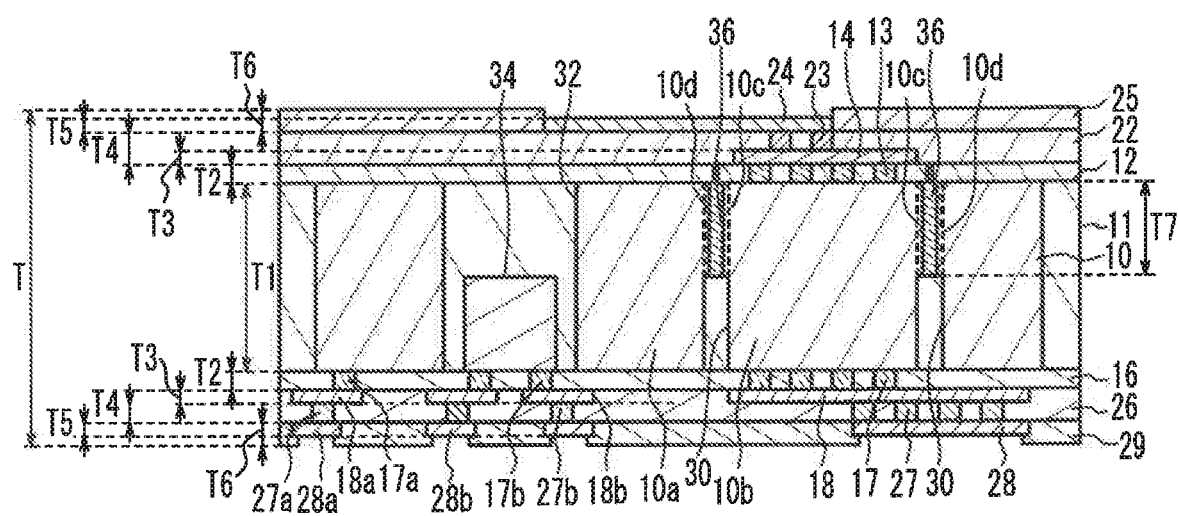
FIG. 1B is a cross-sectional view taken along line A-A in FIG. 1A.

FIG. 1A is a plan view of a multilayer board in accordance with a first embodiment, and FIG. 1B is a cross-sectional view taken along line A-A in FIG. 1A. FIG. 1A illustrates mainly a core layer 10, vias 13 and 17, openings 30 and 32, and an electronic component 34.

As illustrated in FIG. 1A and FIG. 1B, in a multilayer board 100, the core layer 10 includes a main body 10a and an island portion 10b. The openings 30 and 32 are formed in the main body 10a. The island portion 10b is located in the opening 30. The main body 10a and the island portion 10b are insulated from each other. The planar shapes of the island portion 10b and the opening 30 are substantially rectangle shapes. Protrusion portions 10c are located on the side surfaces of four vertices (corners or the vicinities of the corners) of the island portion 10b, which has a substantially rectangle shape, and protrusion portions 10d are located on the side surfaces (corners or the vicinities of the corners) of the opening 30. The protrusion portions 10c and 10d face each other. The electronic component 34 is embedded in the opening 32. It is not necessary to provide the opening 32, and it is not necessary for the electronic component 34 to be embedded. The insulating layer 11 is embedded in the openings 30 and 32. An insulating layer 36 is embedded between the protrusion portions 10c and 10d.

An insulating layer 12 is located on the core layer 10, and a metal layer 14 is located on the insulating layer 12. An insulating layer 22 is located on the metal layer 14 and the insulating layer 12, and a metal layer 24 is located on the insulating layer 22. The vias 13 penetrate through the insulating layer 12, and electrically connect the island portion 10b and the metal layer 14. Vias 23 penetrate through the insulating layer 22, and electrically connect the metal layers 14 and 24. An insulating layer 25 having an opening above the metal layer 24 is located on the insulating layer 22.

An insulating layer 16 is located under the core layer 10, and metal layers 18, 18a, and 18b are located under the insulating layer 16. An insulating layer 26 is located under the metal layers 18, 18a, and 18b and the insulating layer 16, and metal layers 28, 28a, and 28b are located under the insulating layer 26. Vias 17, 17a, and 17b penetrate through the insulating layer 16, and vias 27, 27a, and 27b penetrate through the insulating layer 26. The via 17 electrically connects the metal layer 18 and the island portion 10b. The via 27 electrically connects the metal layer 18 and the metal layer 28. The metal layer 28a is electrically connected to the main body 10a through the via 27a, the metal layer 18a, and the via 17a. When a ground potential is supplied to the metal layer 28a, the main body 10a is grounded. The metal layer 28b is electrically connected to the electronic component 34 through the via 27b, the metal layer 18b, and the via 17b. The metal layers 28, 28a, and 28b function as terminals such as lands. An insulating layer 29 having openings below the metal layers 28, 28a, and 28b is located under the insulating layer 26.

The metal layers 14 and 24, which are located higher than the core layer 10, and the metal layers 18 and 28, which are located lower than the core layer 10, are generally referred to as conductive patterns that are formed of an electrode, a wiring line integrated with the electrode (rewiring), a pad that is in contact with a via or a pillar and covers the via or the pillar, or a wiring line integrated with the pad.

The core layer 10 is a metal layer made of, for example, copper, a copper alloy, iron, an iron ahoy, or a metal material mainly composed of copper. The insulating layers 11, 12, 16, 22, 26, and 36 are made of, for example, a synthetic resin, an epoxy resin, a bismaleimide triazine resin, or a polyimide resin. The synthesis resin may be mixed with a filler such as, but not limited to, a glass fiber. The insulating layers 25 and 29 are made of solder resist such as, but not limited to, an epoxy resin. The metal layers 14, 18, 18a, 18b, 24, 28, 28a, and 28b and the vias 13, 17, 17a, 17b, 23, 27, 27a, and 27b are formed of metal layers mainly composed of, for example, copper, gold, or silver, and may include a barrier layer and/or an adhesion layer. The electronic component 34 may be a chip component such as, but not limited to, a chip capacitor, a chip inductor, or a chip resistor, and is a semiconductor device such as, but not limited to, an integrated circuit or a transistor. The semiconductor device may be a bare chip or a package in which a bare chip is installed.

The thickness T1 of the core layer 10 is, as an example, 340 µm, and is for example, 35 µm to 500 µm. The thickness T2 of each of the insulating layers 12 and 16 is, as an example, 34 µm, and is, for example, 5 µm to 100 µm. The thickness T3 of each of the metal layers 14 and 18 is, as an example, 23 µm, and is, for example, 5 µm to 100 µm. The thickness T4 of each of the insulating layers 22 and 26 is, as an example, 29 µm, and is, for example, 5 µm to 100 µm. The thickness T5 of each of the metal layers 24 and 28 is, as an example, 23 µm, and is, for example, 5 µm to 100 µm. The thickness T6 of each of the insulating layers 25 and 29 is, as an example, 15 µm, and is, for example, 2 µm to 50 µm. The thickness T of the multilayer board 100 is, as an example, 588 µm. The thickness T7 of a connection portion 10e is, for example, 1/10 of the thickness T1 of the core layer 10 to the thickness T1 of the core layer 10.

Figure 2A:
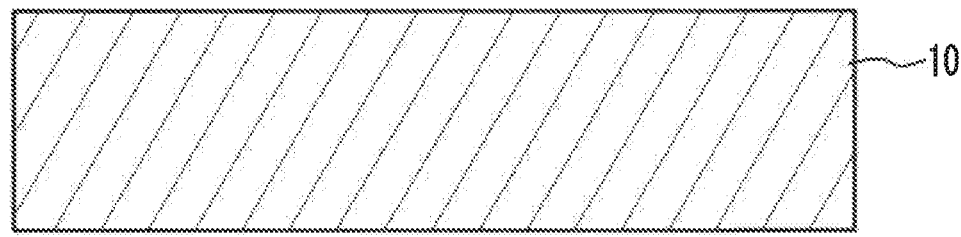
FIG. 2A to FIG. 2C are cross-sectional views (No. 1) illustrating a method of manufacturing the multilayer board in accordance with the first embodiment.

FIG. 2A to FIG. 4C are cross-sectional views illustrating a method of manufacturing the multilayer board in accordance with the first embodiment. The cross-section corresponds to the cross-section taken along line A-A in FIG. 1A. As illustrated in FIG. 2A, a metal foil to be the core layer 10 is prepared. As illustrated in FIG. 2B, the openings 30 and 32 are formed in the core layer 10. The openings 30 and 32 are formed by, for example, etching. The main body 10a and the island portion 10b are connected through the connection portions 10e (bridges). The connection portions 10e are located on the side surfaces of the four vertices of the island portion 10b in plan view, and are formed from the top (or the bottom) of the core layer 10 to the substantially middle of the core layer 10 in cross-sectional view. Here, the connection portions 10e are formed by removing the upper half or the lower half of the core layer 10 by so-called half-etching. Since the island portion 10b and the main body 10a are connected by the connection portions 10e, even when the core layer 10 is handled, the island portion 10b is inhibited from separating from the main body 10a. As illustrated in FIG. 2C, the core layer 10 is attached to a support layer 50.

The support layer 50 is, for example, a resin sheet having an upper surface to which an adhesive agent is applied.

Figure 3A:
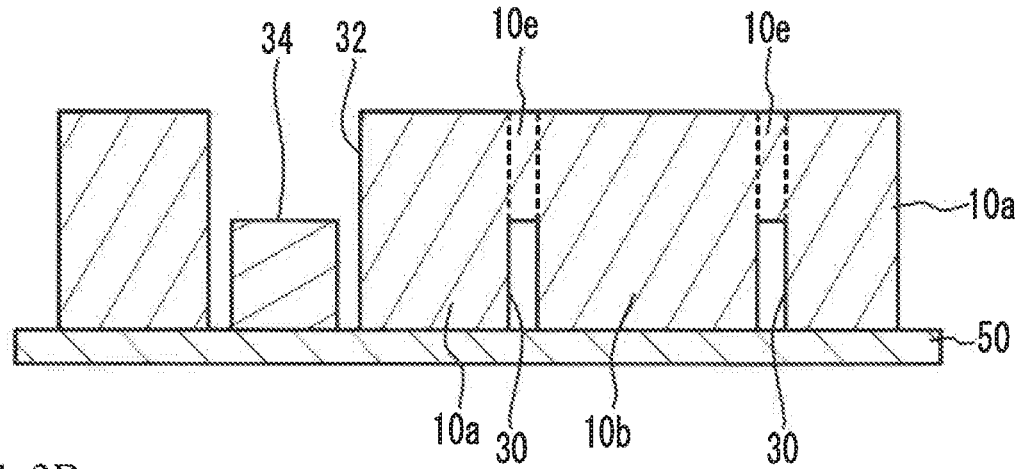
FIG. 3A to FIG. 3C are cross-sectional views (No. 2) illustrating the method of manufacturing the multilayer board in accordance with the first embodiment.
Figure 3B:
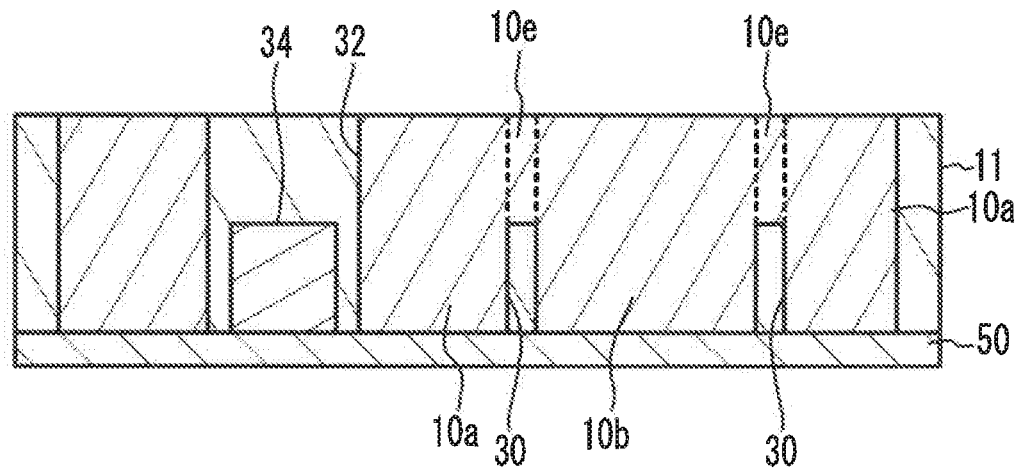
Figure 3C:
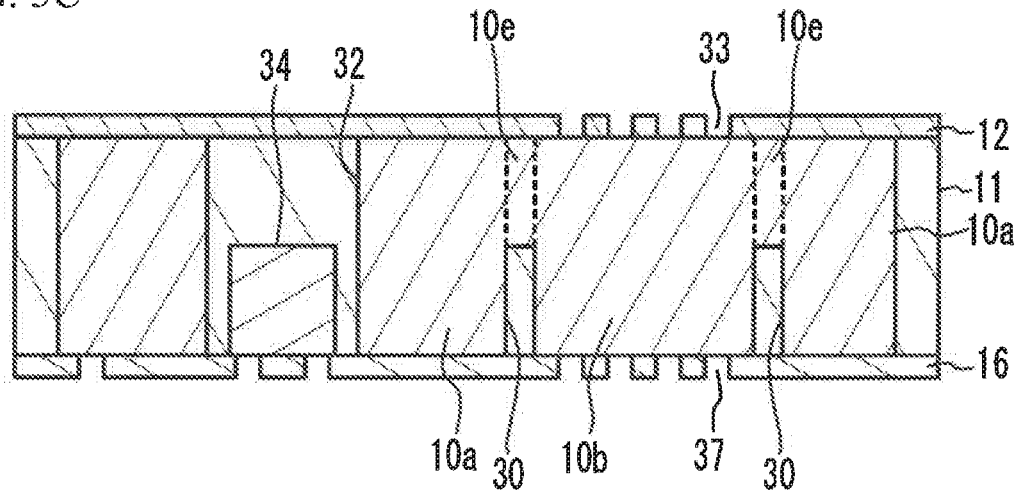

As illustrated in FIG. 3A, the electronic component 34 is mounted on the support layer 50 within the opening 32. As illustrated in FIG. 3B, the openings 30 and 32 are filled with a resin that forms the insulating layer 11. As illustrated in FIG. 3C, the support layer 50 is peeled from the core layer 10. The insulating layer 12 is formed on the upper surface of the core layer 10, and the insulating layer 16 is formed on the lower surface of the core layer 10. Through holes 33 and 37 respectively penetrating through the insulating layers 12 and 16 are formed.

Figure 4A:
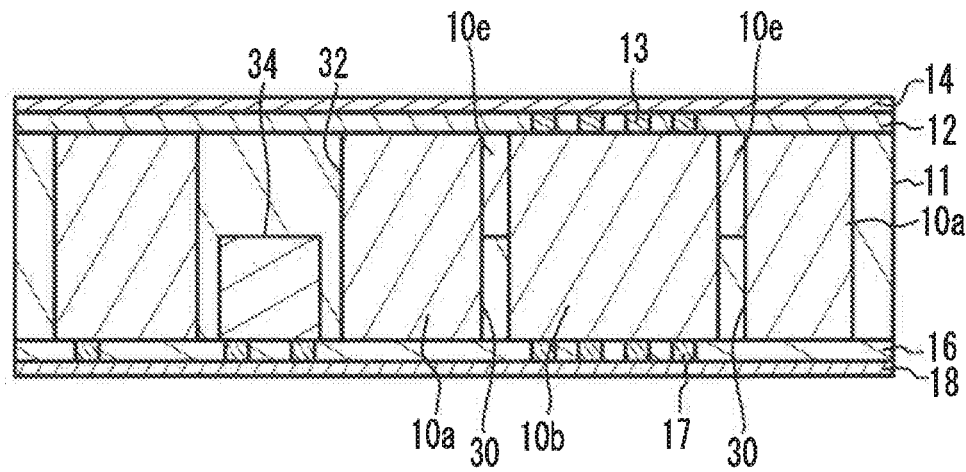
FIG. 4A to FIG. 4C are cross-sectional views (No. 3) illustrating the method of manufacturing the multilayer board in accordance with the first embodiment.
Figure 4B:
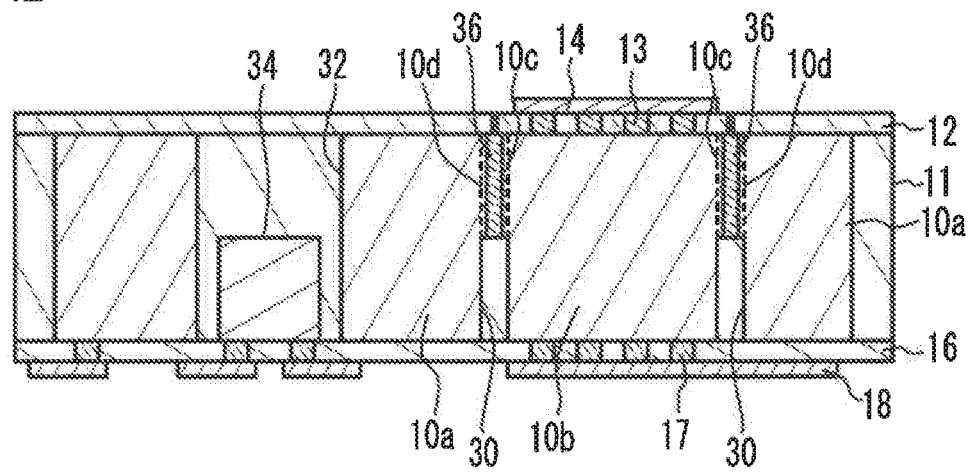
Figure 4C:
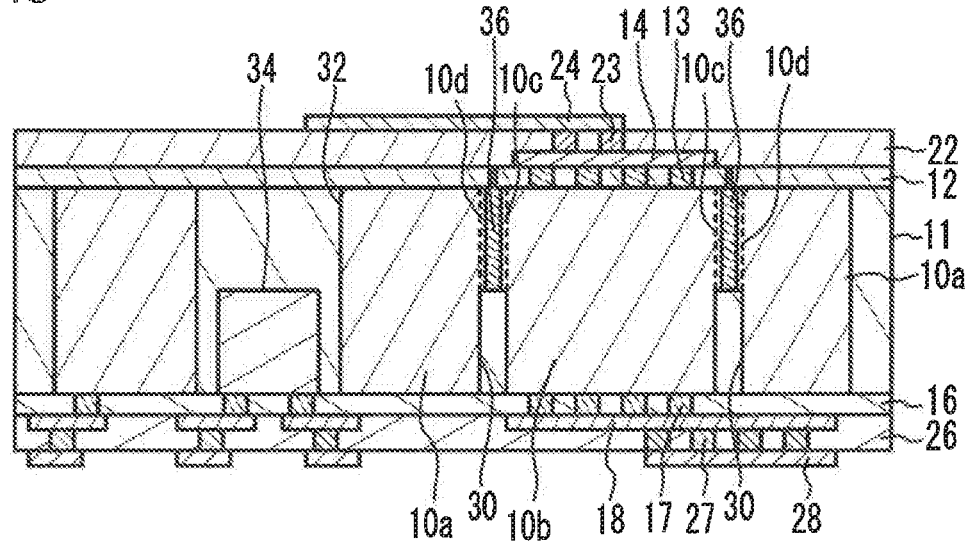

As illustrated in FIG. 4A, the vias 13 and 17 are respectively formed in the through holes 33 and 37. The metal layer 14 is formed on the insulating layer 12, and the metal layer 18 is formed on the insulating layer 16. As illustrated in FIG. 4B, the connection portions 10e are cut. Through this process, the protrusion portions 10c are formed on the side surface of the island portion 10b, and the protrusion portions 10d are formed on the side surface of the main body 10a. The part between the protrusion portions 10c and 10d is filled with a resin as the insulating layer 36. The metal layers 14 and 18 are processed into desired shapes. In FIG. 3C, the connection portions 10e may be cut after forming of the insulating layer 12 and before forming of the through holes 33 and 37.

As illustrated in FIG. 4O, the insulating layer 22 is formed on the insulating layer 12 and the metal layer 14. The insulating layer 26 is formed under the insulating layer 16 and the metal layer 18. The vias 23 and 27 respectively penetrating through the insulating layers 22 and 26 are formed. The metal layer 24 is formed on the insulating layer 22. This process forms conductive patterns such as electrodes and wiring lines of the layer second-closest to the core layer 10. The metal layer 28 is formed under the insulating layer 26. Thereafter, as illustrated in FIG. 1B, the insulating layers 25 and 29, which are made of solder resist, are formed.

Figure 5A:
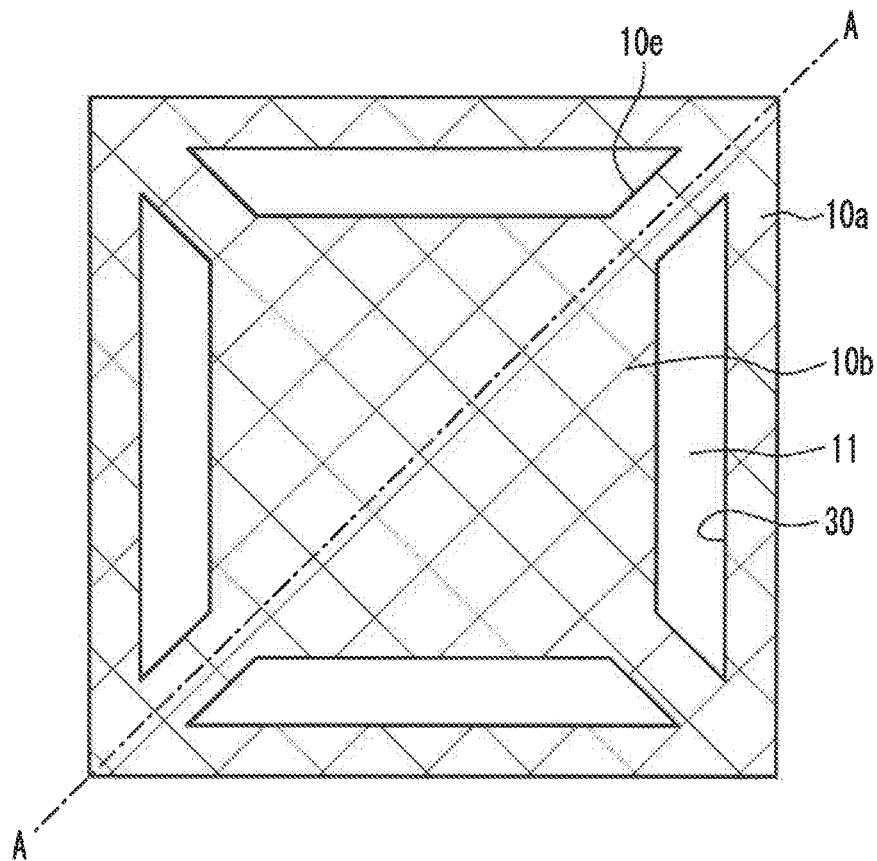
FIG. 5A and FIG. 5B are diagrams (No. 1) illustrating the method of manufacturing the multilayer board in accordance with the first embodiment.

A detailed description will be given of the process of cutting the connection portions 10e between the process of FIG. 4A and the process of FIG. 4B, or before farming of the through holes 33 and 37 in FIG. 3O. FIG. 5A to FIG. 8B are diagrams illustrating the method of manufacturing the multilayer board in accordance with the first embodiment. FIG. 5A, FIG. 6A, and FIG. 7A are plan views mainly illustrating the core layer near the opening 30. FIG. 5B, FIG. 6B, and FIG. 7B to FIG. 8B are cross-sectional views taken along line A-A in FIG. 5A, FIG. 6A, and FIG. 7A, respectively.

Figure 5B:
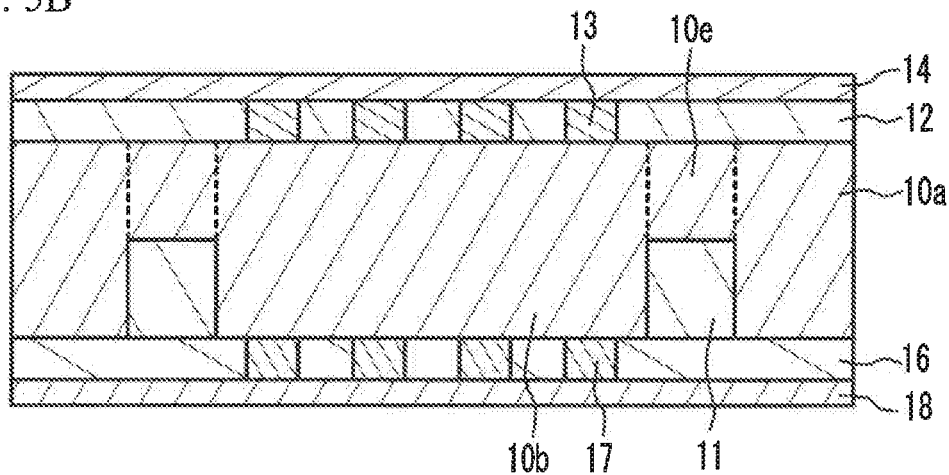
Figure 6A:
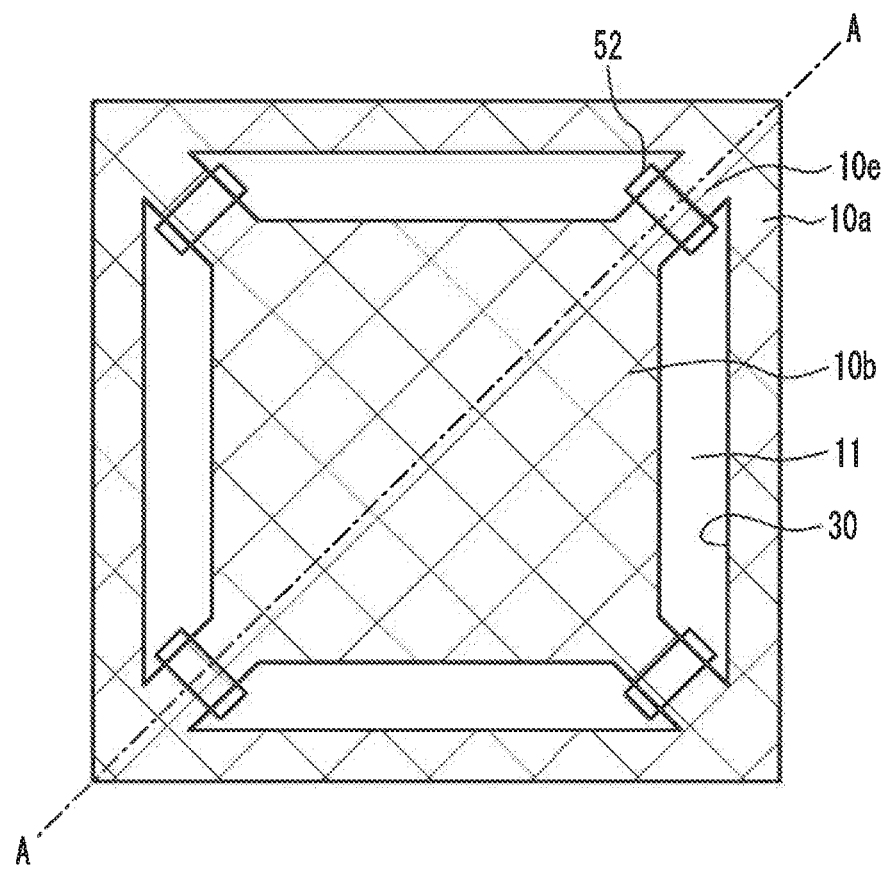
FIG. 6A and FIG. 6B are diagrams (No. 2) illustrating the method of manufacturing the multilayer board in accordance with the first embodiment.

As illustrated in FIG. 5A and FIG. 5B, in the state illustrated in FIG. 4A, the island portion 10b and the main body 10a are connected by the connection portions 10e. The connection portions 10e are located in four vertices of a substantially rectangle shape or in the vicinities of the four vertices in plan view, and located on the upper part or the lower part of the side surface in cross-sectional view. The opening 30 under the connection portion 10e is filled with the insulating layer 11.

Figure 6B:
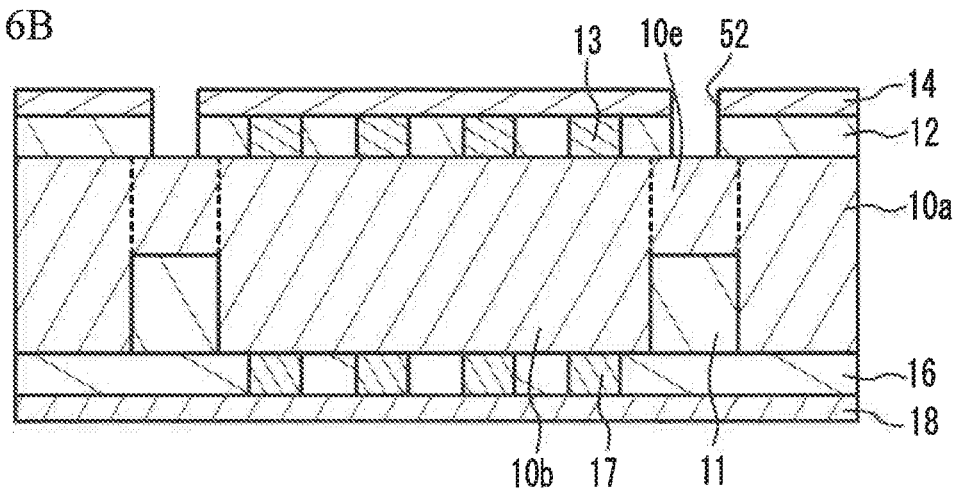
Figure 7A:
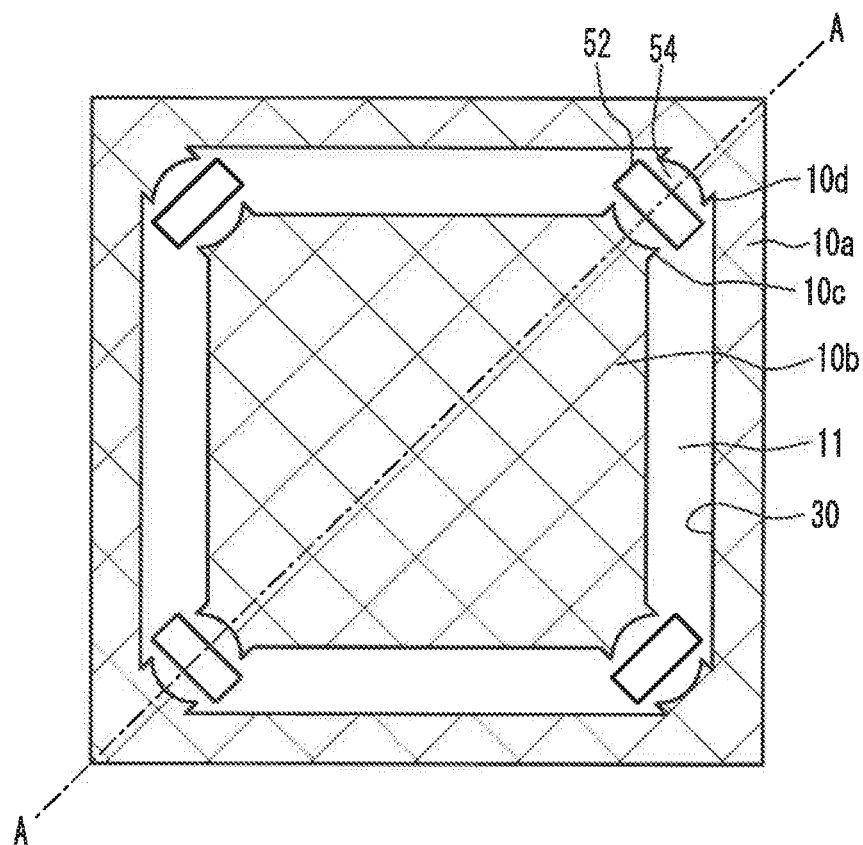
FIG. 7A and FIG. 7B are diagrams (No. 3) illustrating the method of manufacturing the multilayer board in accordance with the first embodiment.

As illustrated in FIG. 6A and FIG. 6B, openings 52 are formed in the metal layer 14 and the insulating layer 12 above the connection portions 10e. The openings 52 are formed by, for example, etching, sandblasting, or laser beam irradiation. The planar shape of the opening 52 is a substantially rectangle shape (or a rectangle shape), and the longer side of the rectangle is substantially perpendicular to the extension direction of the connection portion 10e. The width of the opening 52 in the extension direction of the connection portion 10e is less than the length of the connection portion 10e, and the width of the opening 52 in the direction perpendicular to the extension direction of the connection portion 10e is greater than the width of the connection portion 10e.

Figure 7B:
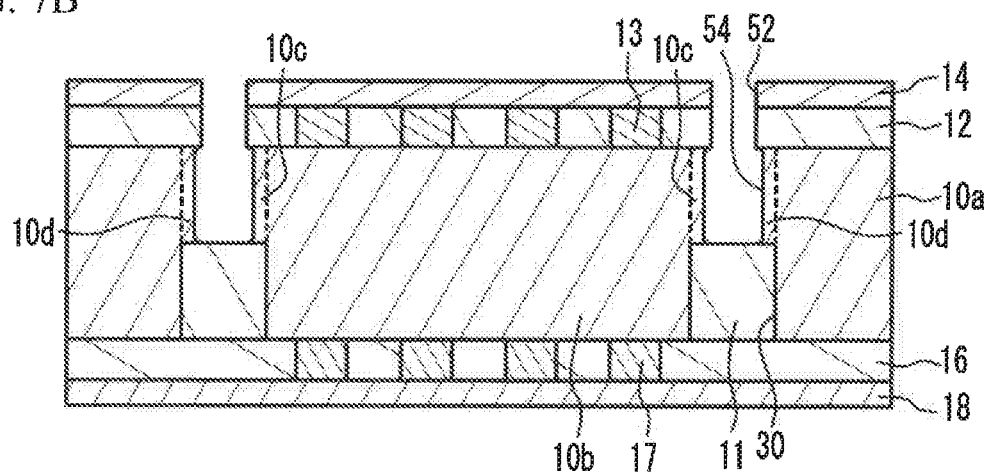

As illustrated in FIG. 7A and FIG. 7B, the connection portion 10e is removed by wet-etching introducing an etching liquid from the opening 52. This process forms the protrusion portions 10c and 10d from the connection portions 10e. In wet-etching, the connection portion 10e is isotropically etched. Thus, an opening 54 that is formed by removing the connection portion 10e becomes larger than the opening 52. The side surfaces and the plane surfaces of the protrusion portions 10c and 10d become arc-shaped. The angles of the corners of the protrusion portions 10c and 10d become acute angles (in other words, two horned portions are formed in the protrusion portion). The protrusion portions 10c and 10d are traces of the connection portions 10e connecting the main body 10a and the island portion 10b.

Figure 8A:
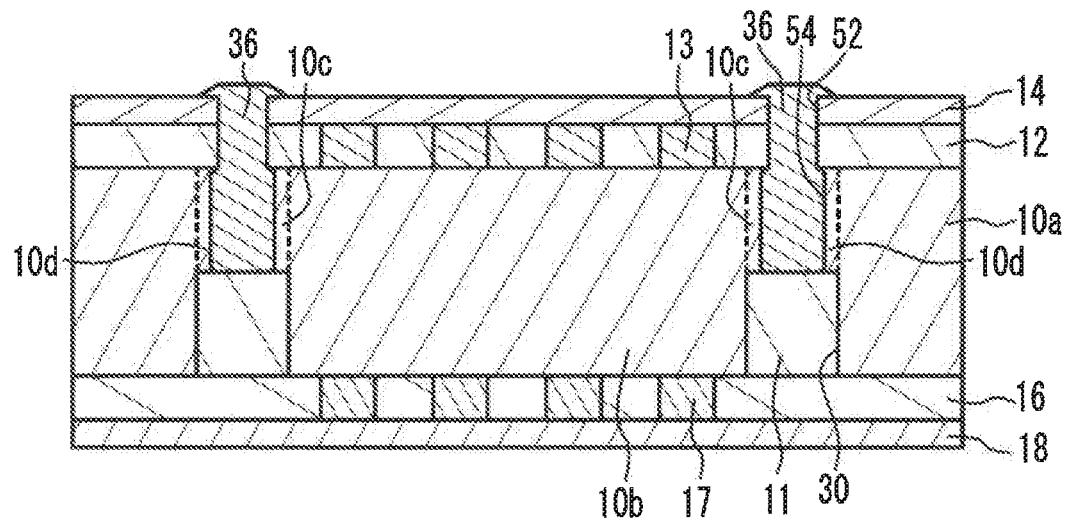
FIG. 8A and FIG. 8B are diagrams (No. 4) illustrating the method of manufacturing the multilayer board in accordance with the first embodiment.
Figure 8B:
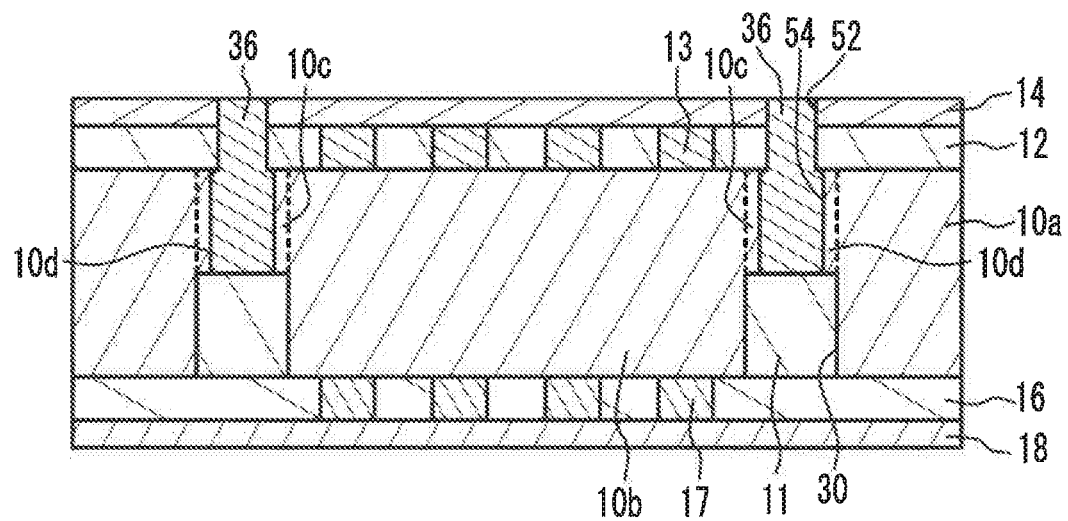

As illustrated in FIG. 8A, the openings 52 and 54 are filled with a resin. The resin is then hardened. This process forms the insulating layer 36 within the openings 52 and 54. The insulating layer 36 is formed by, for example, printing or potting. The insulating layer 36 may be made of the same material as the insulating layers 11 and 12 or a different material from the insulating layers 11 and 12. The insulating layer 36 may be formed with a bulging surface. In this case, as illustrated in FIG. 8B, the upper surface of the insulating layer 36 is polished or ground such that the upper surface of the insulating layer 36 and the upper surface of the metal layer 14 are flat. Thereafter, the metal layers 14 and 18 are processed into desired shapes, and the state of FIG. 4B is obtained.

Figure 2B:
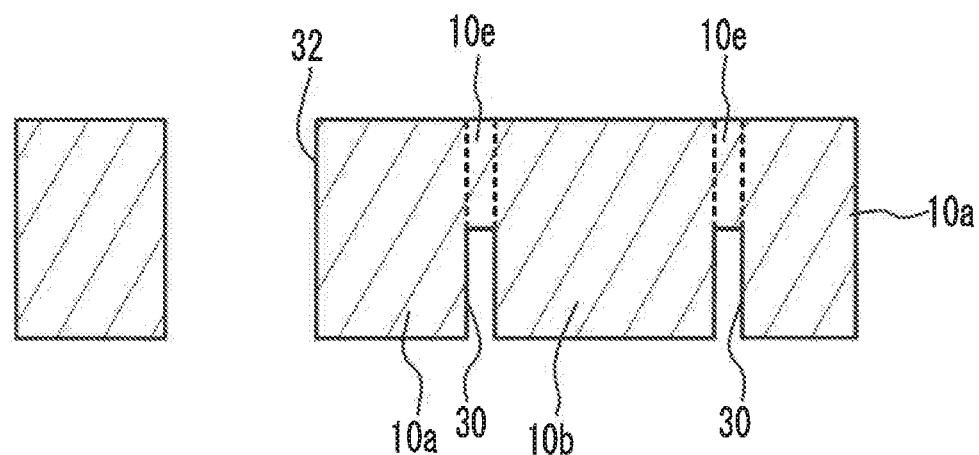
Figure 2C:
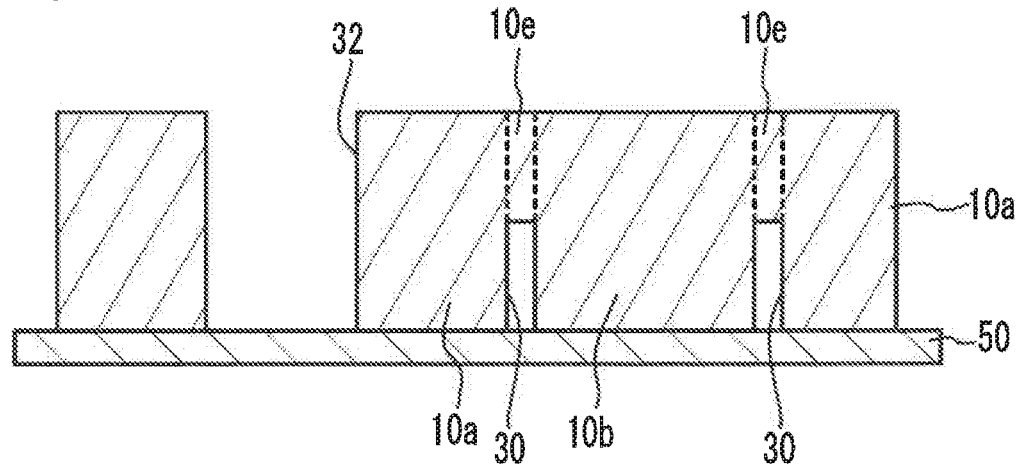

In the first embodiment, in FIG. 2B, the core layer 10 (a metal core layer) is formed. The core layer 10 includes the main body 10a, the island portion 10b, and four connection portions 10e. The island portion 10b has a substantially rectangle shape and is located within the opening 30. The opening has a substantially rectangle shape and is formed in the main body 10a. The four connection portions 10e connect the island portion 10b and the main body 10a. Then, as illustrated in FIG. 3B and FIG. 3C, the insulating layers 11 and 12 (a first insulating layer) are formed on the core layer 10 and in the opening 30. Furthermore, as illustrated in FIG. 6A and FIG. 6B, the openings 52 (holes) reaching the connection portions 10e are formed in the metal layer 14 and the insulating layer 12. As illustrated in FIG. 7A and FIG. 7B, the main body 10a and the island portion 10b are electrically separated from each other by removing the connection portions 10e through the openings 52. As seen above, since the connection portions 10e are present when the insulating layers 11 and 12 are formed, the island portion 10b is formed within the opening 30 while the flatness of the island portion 10b is maintained and the position of the island portion 10b is maintained. Thereafter, the connection portions 10e are removed.

Figure 9A:
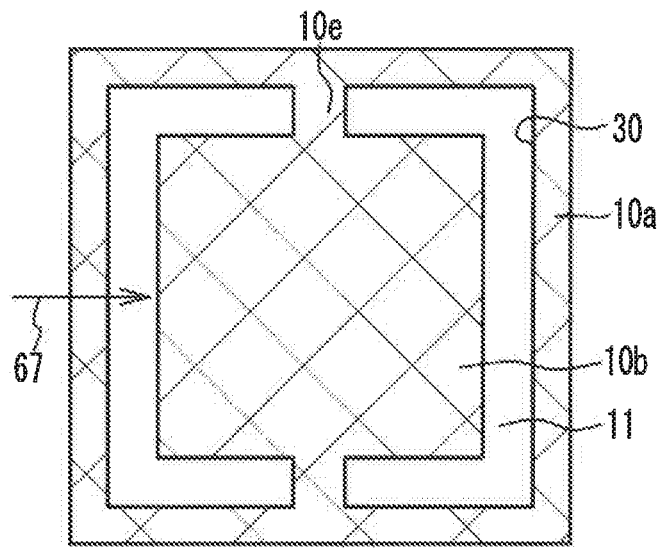
FIG. 9A to FIG. 9C are plan views of the vicinity of an island portion in first and second comparative examples and the first embodiment, respectively.
Figure 9B:
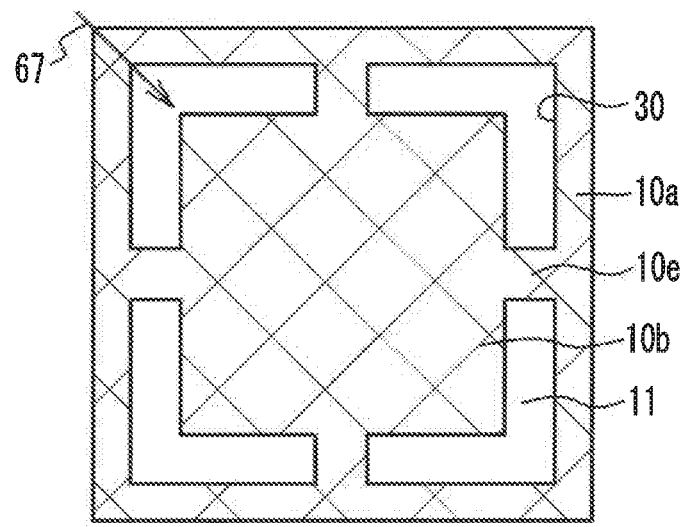
Figure 9C:
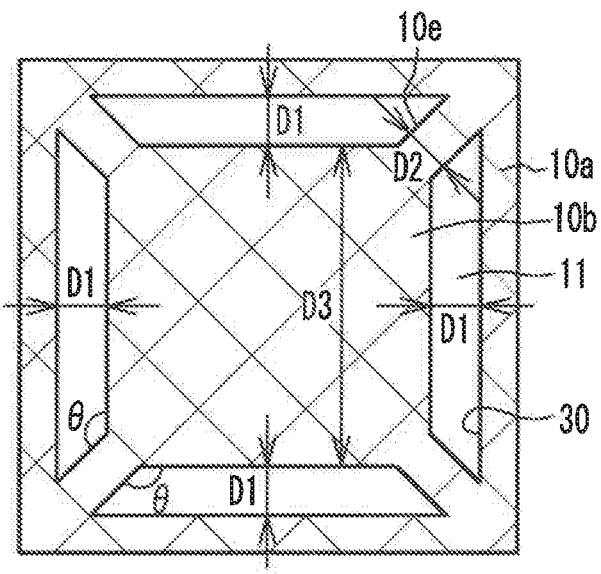

The positions in which the connection portions 10e are to be provided will be considered. FIG. 9A to FIG. 9C are plan views of the vicinity of the island portion in first and second comparative examples and the first embodiment. When two connection portions 10e are provided as in the first comparative example illustrated in FIG. 9A, the island portion 10b rotates when a force is applied to the island portion 10b from the side as indicated by an arrow 67. When four connection portions 10e are provided near the centers of the four sides of the island portion 10b as in the second comparative example illustrated in FIG. 9B, the island portion 10b rotates, the island portion 10b is separated from the main body 10a, and/or the island portion 10b deforms when a force is applied to a corner of the island portion 10b as indicated by the arrow 67.

As illustrated in FIG. 9C, in the first embodiment, the four connection portions 10e are located in the four vertices (corners) or the vicinities of the four vertices of the island portion 10b, which has a substantially rectangle shape, in plan view, and connect the side surface of the island portion 10b and the side surface of the main body 10a in cross-sectional view. This structure inhibits the island portion 10b from rotating, being separated, and/or deforming even when a force is applied to the island portion 10b between the process of FIG. 2B and the process of FIG. 3B. In the first embodiment, the connection portion 10e is formed on the upper half of the side surface by half-etching. However, the connection portion 10e may be formed on the lower half of the side surface, or may be formed from the top to the bottom of the side surface of the connection portion 10e.

As illustrated in FIG. 3C, the insulating layer 16 (a third insulating layer) is formed under the core layer 10. As illustrated in FIG. 4A, the metal layer 14 (a first metal layer), which is located on the insulating layer 12 and mechanically connected to the island portion 10b through the vias 13 (first metal pillars), is formed. The metal layer 18 (a second metal layer), which is mechanically connected to the island portion 10b through the via 17 (a second metal pillar), is formed under the insulating layer 16. Provision of many vias 13 and 17 reduces the electrical resistance and the thermal resistance between the metal layers 14 and 18. The island portion 10b may be provided for a purpose such as, for example, heat sink other than the purpose of connecting the metal layers 14 and 18.

The thicknesses T2 of the insulating layers 12 and 16 are preferably equal to or less than ⅕ of the thickness T1 of the core layer 10. This configuration reduces the electrical resistance and the thermal resistance between the metal layers 14 and 18. The sum of the areas of the surfaces connected to the island portion 10b of the vias 13 is preferably equal to or greater than 1% of, more preferably equal to or greater than 2% of, further preferably equal to or greater than 5% of the planar area of the island portion 10b. The sum of the areas of the surfaces connected to the island portion 10b of the vias 17 is preferably equal to or greater than 1% of, more preferably equal to or greater than 2% of, further preferably equal to or greater than 5% of the planar area of the island portion 10b. This configuration reduces the electrical resistance and the thermal resistance between the metal layers 14 and 18.

In the multilayer board manufactured as described above, the insulating layers 11 and 12 are provided in the following locations. First, the insulating layer 11 and 12 are provided in four regions (spaces) between the four vertices of the island portion 10b, which has a substantially rectangle shape, and the four vertices of the opening 30, which has a substantially rectangle shape, and provided in a ring-shaped space surrounding the island portion 10b. Moreover, the four openings 52 and 54 (holes) that reach the surface of the insulating layer 12 and to which the side surface of the main body 10a and the side surface of the island portion 10b are exposed, are formed. The insulating layer 36 (a second insulating layer) fills the four openings 52 and 54. Furthermore, the insulating layers 12 and 16 respectively cover the front surface (the upper surface) and the back surface (the lower surface) of the core layer 10. In addition, at least one of the main body 10a and the island portion 10b includes the protrusion portions 10c (horned portions) of which the side surfaces are exposed to the four openings 54.

The island portion 10b is covered with the insulating layers 11, 12, 16 and 36 such as resin. The insulating layers 11, 12, 16 and 36 have linear expansion coefficients different from that of the island portion 10b. Thus, a stress may be applied to the island portion 10b, and thereby, the island portion 10b may warp upward or downward. This may peel the island portion 10b and the vias 13 and 17. The adhesion between the insulating layers 11, 12 and 36 and the island portion 10b is enhanced by anchor effect by providing the protrusion portions 10c and 10d. This inhibits the warpage of the island portion 10b, and maintains the good contact between the island portion 10b and the vias 13 and 17 on and under the island portion 10b.

It can be said that the island portion 10b and the opening 30 have a substantially rectangle shape as long as the deformation of the island portion 10b is inhibited compared to those of the first and second comparative examples. For example, the planar shapes of the island portion 10b and the opening 30 may be a shape that is deformed from a rectangle shape in the process of forming the island portion 10b and the opening 30 (for example, an etching process), or may be a shape in which the connection portions 10e and the protrusion portions 10c and 10d are provided to a rectangle shape.

When the opening 54 is formed by wet-etching, it is difficult to control the size of the opening 54. A too large opening 54 results in the decrease in the area of the island portion 10b. Thus, it is preferable that only four connection portions 10e are provided to one island portion 10b. The width D2 of the connection portion 10e is preferably equal to or less than ⅕ of, more preferably equal to or less than 1/10 of the width D3 of the shorter side of the island portion 10b. Furthermore, the width D2 is preferably equal to or less than two times the thickness T1 of the island portion 10b. The thickness T7 of the connection portion 10e is preferably equal to or less than ⅔ of, more preferably equal to or less than ½ of the thickness T1 of the island portion 10b. To secure the strength of the connection portion 10e, the width D2 of the connection portion 10e is preferably equal to or greater than 1/100 of the width D3. The thickness T7 of the connection portion 10e is preferably equal to or greater than 1/10 of the thickness T1 of the island portion 10b.

It is preferable that the distances D1 between the four sides of the island portion 10b and the respective four sides of the opening 30 are substantially equal to each other. This structure allows the island portion 10b to be held by the four connection portions 10e in a balanced manner, The distance D1 is preferably equal to or less than ⅕ of, more preferably equal to or less than 1/10 of the width D3 of the island portion 10b. This structure allows the size reduction. The angle θ between each of the four connection portions 10e and the side of the island portion 10b is preferably an obtuse angle. This structure allows the island portion 10b to be held by the four connection portions 10e in a balanced manner.

Figure 10A:
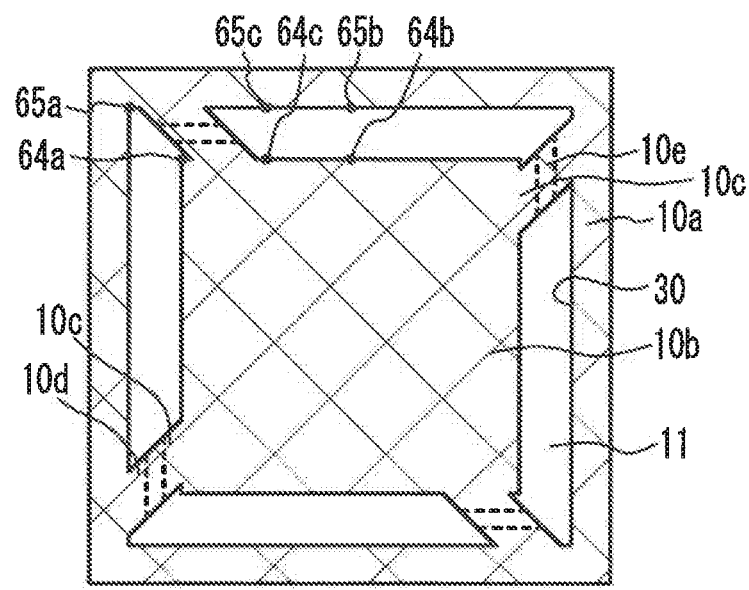
FIG. 10A and FIG. 10B are plan views of the vicinity of the island portion of the first embodiment.
Figure 10B:
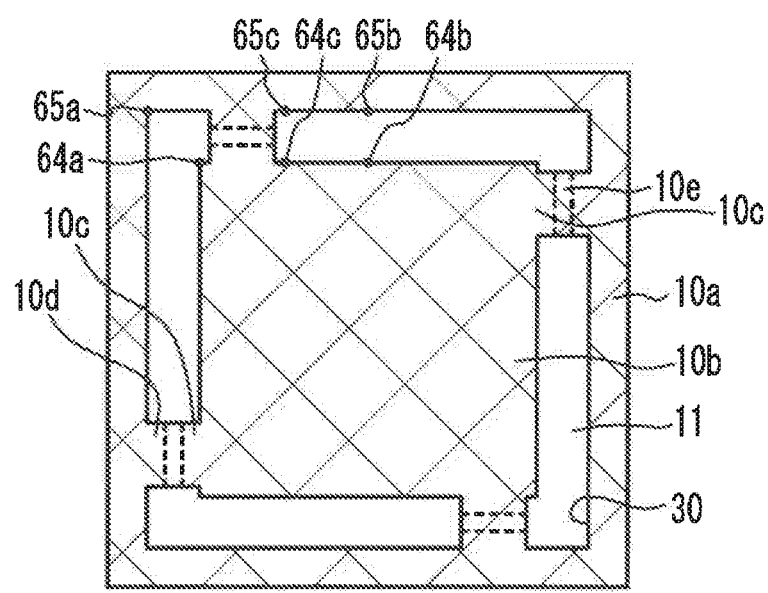

FIG. 10A and FIG. 10B are plan views of the vicinity of the island portion in the first embodiment. In the connection portion 10e, the parts that become the protrusion portions 10c and 10d are indicated by dashed lines. As illustrated in the FIG. 10A the connection portion 10e connects the vicinity of a vertex 64a of the island portion 10b and the vicinity of a vertex 65a of the opening 30. As illustrated in FIG. 10B, the connection portion 10e may extend in the direction perpendicular to the side of the island portion 10b.

When the connection portion 10e is located in the vicinity of the vertex 64a of the island portion 10b and the vicinity of the vertex 65a of the opening 30, the protrusion portion 10c is located in the vicinity of the vertex 64a and the protrusion portion 10d is located in the vicinity of the vertex 65a. It can be said that the protrusion portion 10c is located in the vicinity of the vertex 64a and the protrusion portion 10d is located in the vicinity of the vertex 65a as long as the deformation of the island portion 10b is inhibited compared with that of the second comparative example. The vicinity of the vertex 64a is the area closer to the vertex 64a than a midpoint 64c between a midpoint 64b of the side of the island portion 10b and the vertex 64a, for example. The vicinity of the vertex 65a is the area closer to the vertex 65a than a midpoint 65c between a midpoint 65b of the side of the opening 30 and the vertex 65a.

As seen above, it is sufficient if the four connection portions 10e connect the side surfaces of the four vertices or the side surfaces of the vicinities of the four vertices of the island portion 10b, which has a substantially rectangle shape, and the side surface of the main body 10a. It is sufficient if the openings 52 and 54 are formed in four regions between the vertices 64a or the vicinities of the vertices 64a of the island portion 10b and the vertices 65a or the vicinities of the vertices 65a of the opening 30.

Figure 11A:
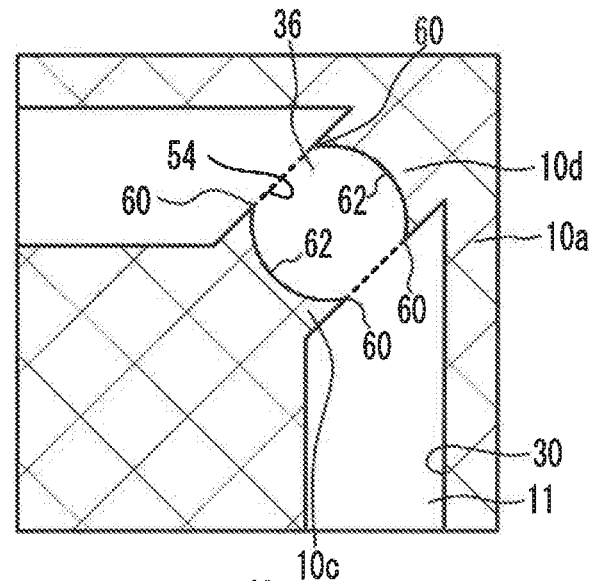
FIG. 11A to FIG. 11O are plan views of the vicinity of a vertex in the first embodiment.
Figure 11B:
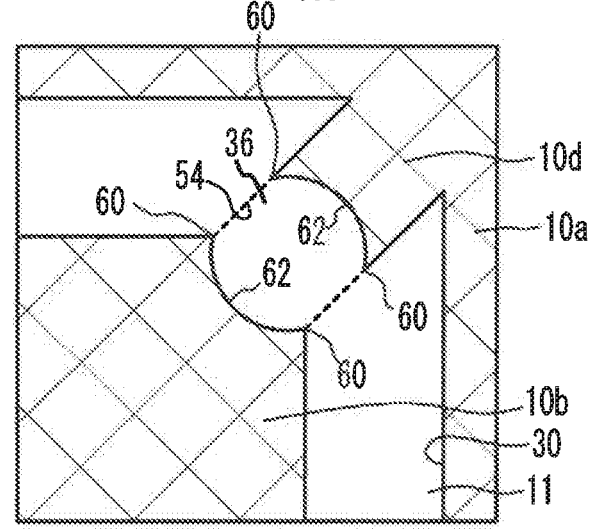
Figure 11C:
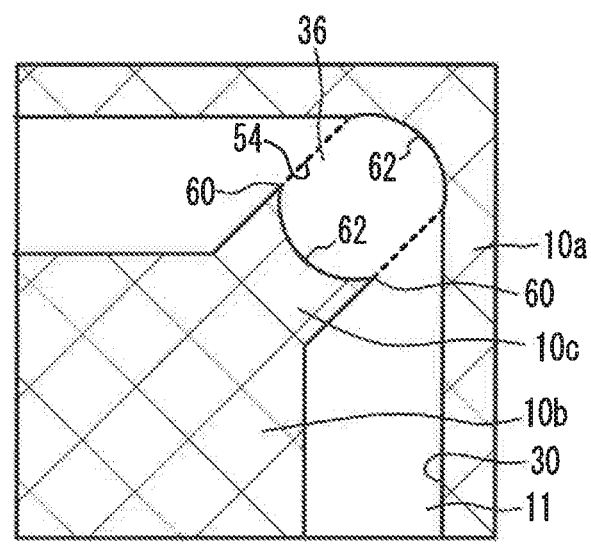

FIG. 11A to FIG. 11C are plan views of the vicinity of the vertex in the first embodiment. As illustrated in FIG. 11A, when the connection portion 10e is removed by wet-etching using the opening 52 as a mask, side surfaces 62 of the protrusion portions 10c and 10d that are exposed to the opening 54 and are in contact with the insulating layer 36 have curved faces the distance between which is large in the center and decreases at greater distances from the center. As seen above, horned portions 60 are formed in the protrusion portions 10c and 10d, and the angle of the horned portion 60 is an acute angle.

As illustrated in FIG. 11B, when the opening 52 is located closer to the island portion 10b than to the main body 10a, the protrusion portion 100 is not formed on the side surface of the island portion 10b, and the side surface 62 facing the protrusion portion 10d of the island portion 10b has a curved face. The angles of the horned portions 60 on the side surfaces 62 of the protrusion portion 10d and the island portion 10b are acute angles. As illustrated in FIG. 11C, when the opening 52 is located closer to the main body 10a than to the island portion 10b, the protrusion portion 10d is not formed on the side surface of the main body 10a, and the side surface 62 facing the protrusion portion 10c of the main body 10a has a curved face. The angles of the horned portions 60 on the side surfaces 62 of the protrusion portion 10c and the main body 10a are acute angles.

As illustrated in FIG. 11A to FIG. 11C, it is sufficient if the protrusion portions 10c and 10d are located on at least one of the side surface of the island portion 10b and the side surface of the main body 10a in each of four regions between the four vertices 64a or the vicinities of the four vertices 64a and the four vertices 65a or the vicinities of the four vertices 65a of the opening 30 having a substantially rectangle shape.

In the first embodiment, the density of current flowing through the island portion 10b from the metal layer 14 to the metal layer 18 was simulated. The simulation conditions are as follows.

Materials of the core layer 10 and the metal layers 14 and 16: Copper
 Thickness T1 of the core layer 10: 340 µm
 Thicknesses T2 of the vias 13 and 17: 68 µm
 Diameters of the vias 13 and 17: 50 µm
 Number of the vias 13 and 17:21×21

Figure 12:
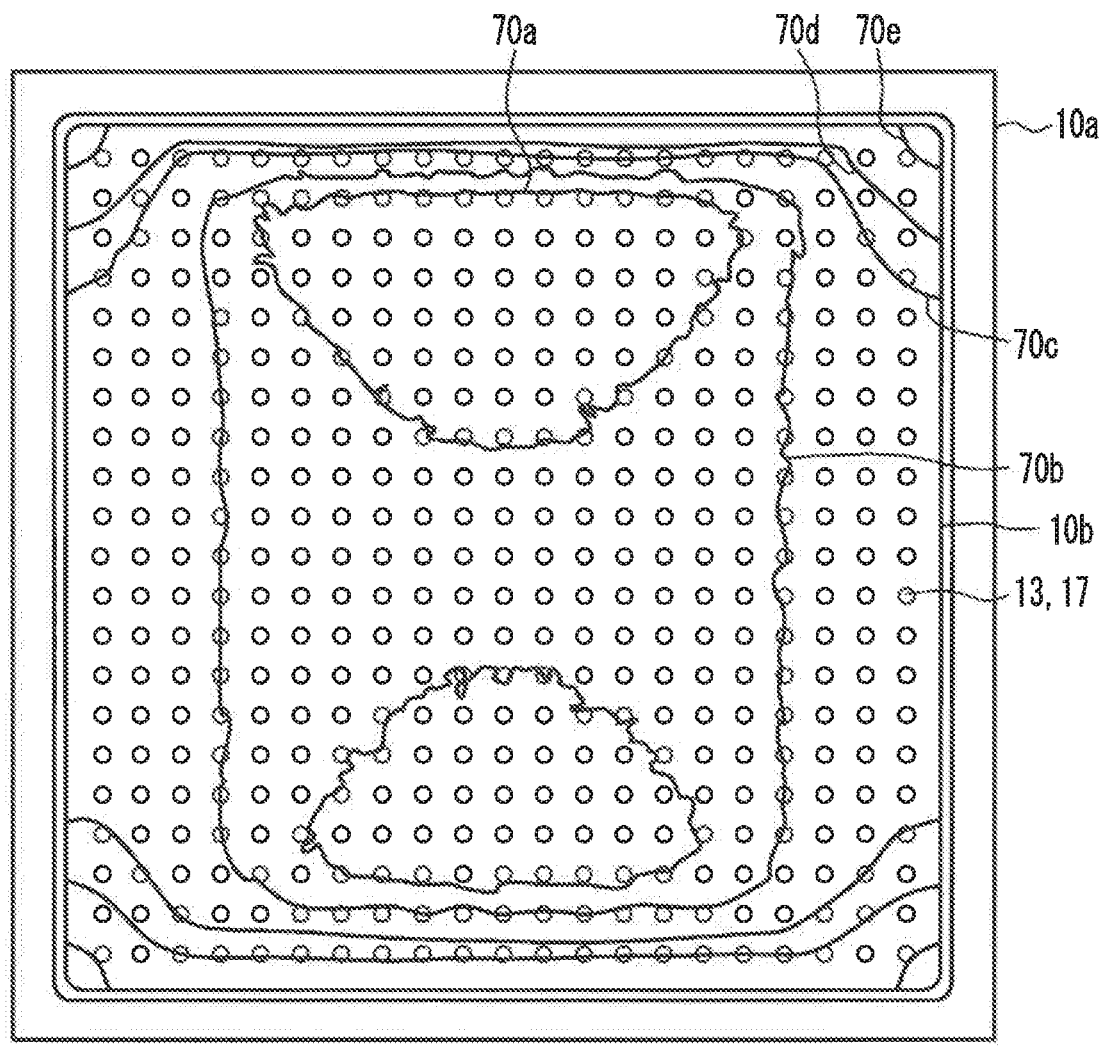
FIG. 12 illustrates the density of current flowing through the island portion of the first embodiment.

FIG. 12 illustrates the density of current flowing through the island portion in the first embodiment. In FIG. 12, the current density in a region 70a is the highest, and the current density decreases in the order of regions 70b, 70c, 70d and 70e. As illustrated in FIG. 12, the density of current flowing through the center part of the island portion 10b is high, and the current density near the vertex (the corner) is low.

In the first embodiment and the variation thereof, the connection portions 10e are located in the vicinities of the vertices of the island portion 10b. Because of this structure, even when a part of the island portion 10b is removed as illustrated in FIG. 11B at the time of removing the connection portions 10e, the regions, in which the current density is low, of the island portion 10b are removed. Thus, the effect on the resistance of the island portion 10b is small.

First Variation of the First Embodiment

Figure 13A:
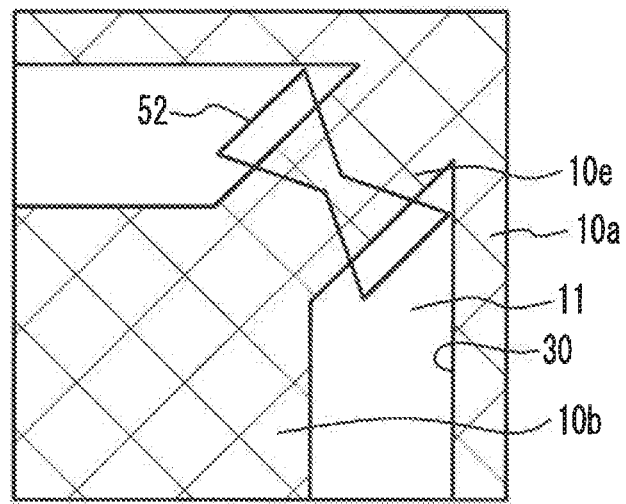
FIG. 13A to FIG. 13C are plan views of the vicinity of a vertex in a first variation of the first embodiment.
Figure 13B:
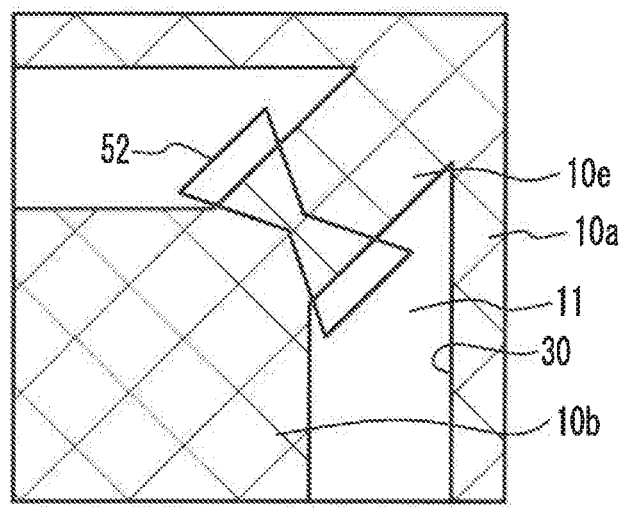
Figure 13C:
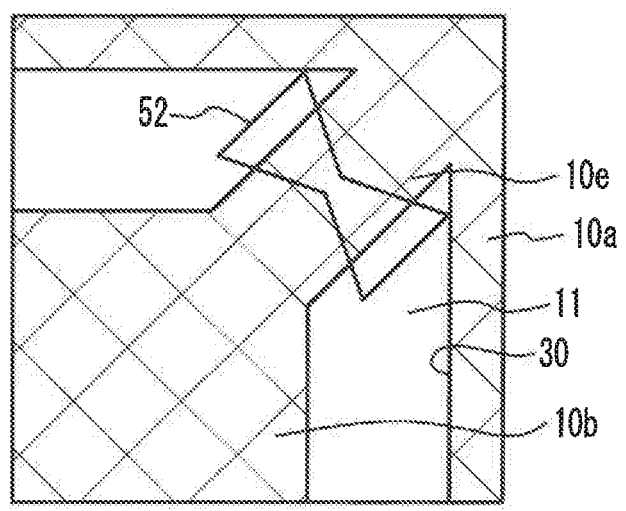

FIG. 13A to FIG. 13C are plan views of the vicinity of a vertex in a first variation of the first embodiment. As illustrated in FIG. 13A to FIG. 13C, the shape of the opening 52 is made to be a shape obtained by connecting vertices of triangles. In FIG. 13A, the opening 52 is located over the connection portion 10e in the position near the middle between the island portion 10b and the main body 10a. In FIG. 13B, the opening 52 is located over the connection portion 10e in the position closer to the island portion 10b than to the main body 10a. In FIG. 13C, the opening 52 is located over the connection portion 10e in the position closer to the main body 10a than to the island portion 10b.

Figure 14A:
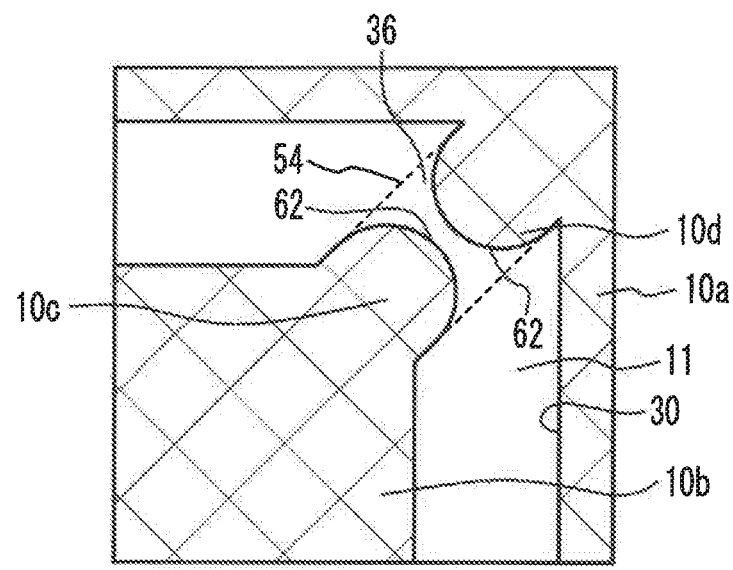
FIG. 14A to FIG. 14O are plan views of the vicinity of a vertex in the first variation of the first embodiment.
Figure 14B:
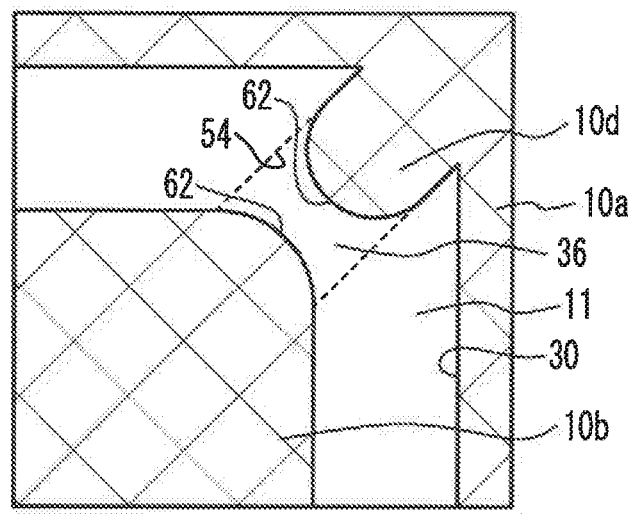
Figure 14C:
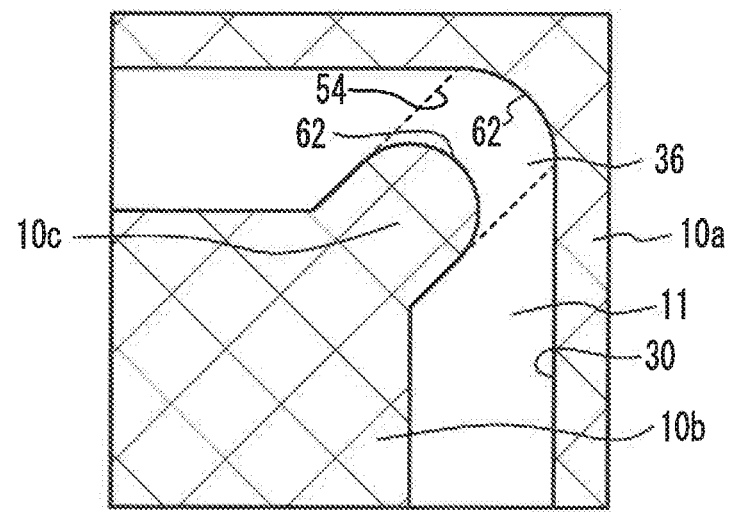

FIG. 14A to FIG. 14C are plan views of the vicinity of the vertex in the first variation of the first embodiment. When the connection portion 10e is etched by using the opening 52 illustrated in FIG. 13A, the side surfaces 62 exposed to the opening 54 of the protrusion portions 10c and 10d have curved faces the distance between which is short in the center and increases at greater distances from the center as illustrated in FIG. 14A. Thus, an acute-angled horned portion is formed on neither the side surface of the protrusion portion 10c nor the side surface of the protrusion portion 10d.

When the connection portion 10e is etched by using the opening 52 illustrated in FIG. 13B, the protrusion portion 10c is not formed, and the protrusion portion 10d is formed as illustrated in FIG. 14B. An acute-angled horned portion is formed on neither the side surface of the protrusion portion 10d nor the side surface of the island portion 10b. When the connection portion 10e is etched by using the opening 52 illustrated in FIG. 13C as illustrated in FIG. 14C, the protrusion portion 10d is not formed, and the protrusion portion 10c is formed. An acute-angled horned portion is formed on neither the side surface of the protrusion portion 10c nor the side surface and main body 10a.

When the angles of the horned portions 60 on the side surface 62 are acute angles as illustrated in FIG. 11A to FIG. 11C of the first embodiment, crack is easily formed in the insulating layers 11 and 36 due to thermal impact or the like. Furthermore, when a high voltage is applied between the island portion 10b and the main body 10a, discharge may occur between the island portion 10b and the main body 10a due to the acute angle of the horned portion 60 and a crack. In the first variation of the first embodiment, the horned portion on the side surface of the island portion 10b is rounded, and the entire side surface has an obtuse angle. Thus, crack is inhibited from being formed in the insulating layers 11 and 36, and discharge between the island portion 10b and the main body 10a is prevented.

Second Variation of the First Embodiment

In a second variation of the first embodiment, after the process of FIG. 2B, the surface of the core layer 10 is roughened. The surface of the core layer 10 is roughened by, for example, etching or blasting. This enhances the adhesion between the insulating layers 11, 12 and 16 and the core layer 10. On the other hand, the side surfaces 62 illustrated in FIG. 11A to FIG. 11C and FIG. 14A to FIG. 14C in the first embodiment are formed after the process of roughening. Thus, the side surfaces 62 are not roughened.

Figure 15A:
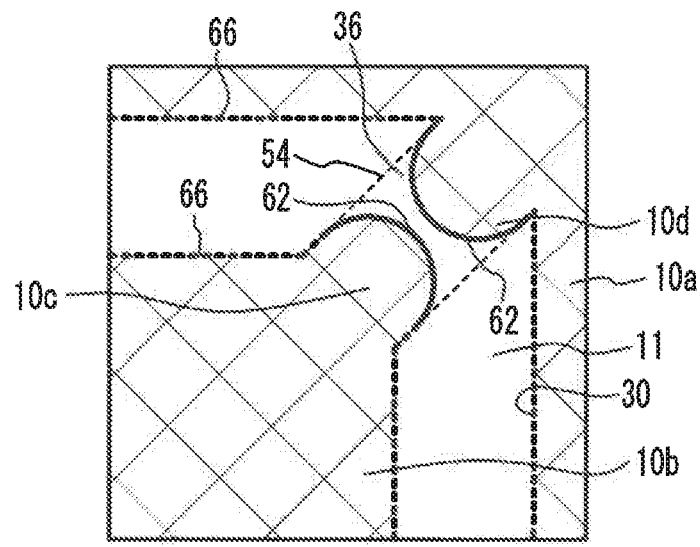
FIG. 15A to FIG. 15C are enlarged views of the vicinity of the vertex in a second variation of the first embodiment.
Figure 15B:
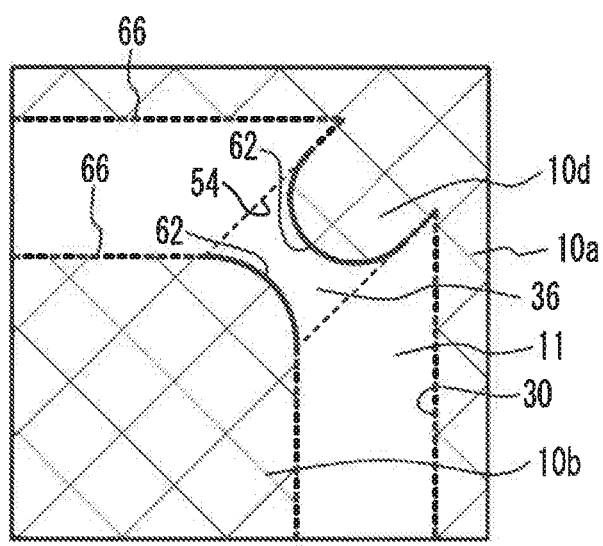
Figure 15C:
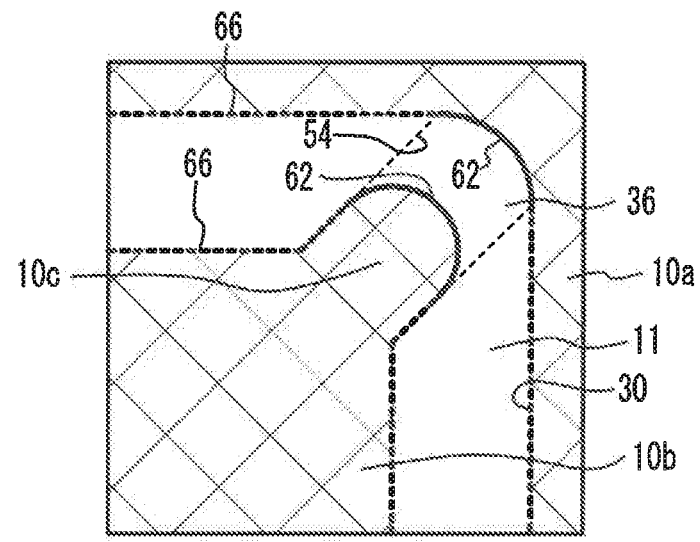

FIG. 15A to FIG. 15C are enlarged views of the vicinity of the vertex in the second variation of the first embodiment. As illustrated in FIG. 15A to FIG. 15C, the side surfaces 62 exposed to the opening 54 of the core layer 10 are not roughened. Surface 66 other than the side surfaces 62 of the core layer 10 are roughened. The side surfaces 62 exposed to the opening 54 of the core layer 10 become flatter than other surfaces 66 of the core layer 10. When the surface 66 is roughened in the first embodiment and the first variation thereof, the island portion 10b has four side surfaces 62 that are not roughened. The ratio of the sum of the areas of the side surfaces 62 to the area of the entire side surface of the island portion 10b is 50% or less.

As described above, in the first embodiment and the variations thereof, horned portions are left in the four corners of the island portion 10b to inhibit the warpage of the island portion 10b by the anchor effect of the horned portions. As a result, the contact defects between the vias 13 and 17 (pillars) and the island portion 10b are inhibited. Since the horned portions cause discharge to be more likely to occur, discharge is inhibited and the breakage of the circuit is inhibited by rounding the horned portions as in the first variation of the first embodiment. The flatness of the island portion 10b is maintained and the uniform filling of the vias 13 and 17 (pillars) becomes possible by providing the connection portions 10e in the four corners or the vicinities of the four corners. This is because when the island portion 10b tilts, the heights of some pillars become large, while the heights of some pillars become low.

As illustrated in FIG. 12, when the current density distribution is examined, it is difficult for current to flow thorough the four corners. Thus, even when the connection portions 10e are provided to the four corners and removed in the latter process, the current capacitance itself does not greatly decrease.

In addition, as the size of the island portion 10b, i.e., the volume of the island portion 10b or the area of the surface of the island portion 10b in plan view increases, the resistance value decreases, and larger electric current can flow. As a result, the island portion 10b becomes effective as a current pathway from the bottom (the back) to the top (the front) of the multilayer board or from the top (the front) to the bottom (the back) of the multilayer board.

Second Embodiment

Figure 16A:
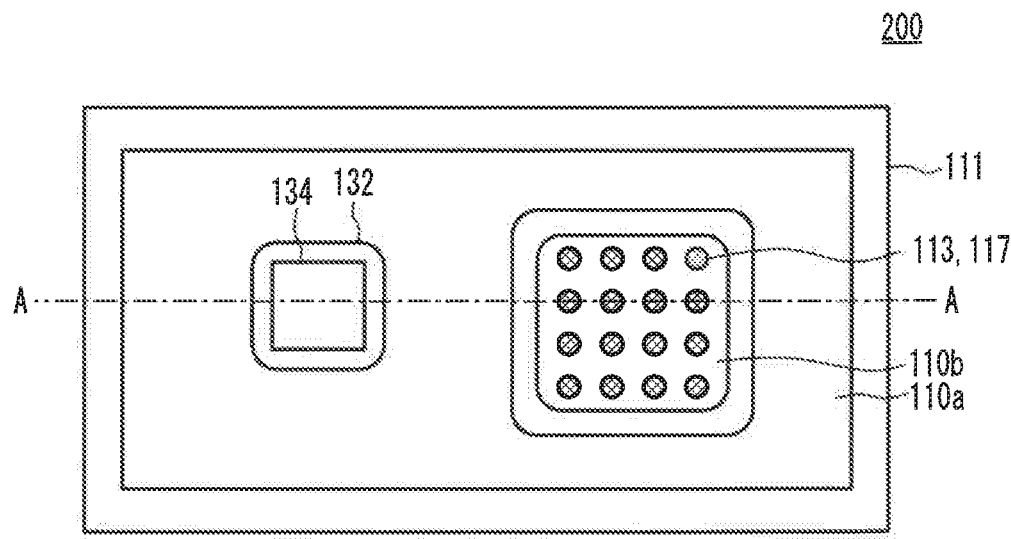
FIG. 16A is a plan view of a multilayer board in accordance with a second embodiment.
Figure 16B:
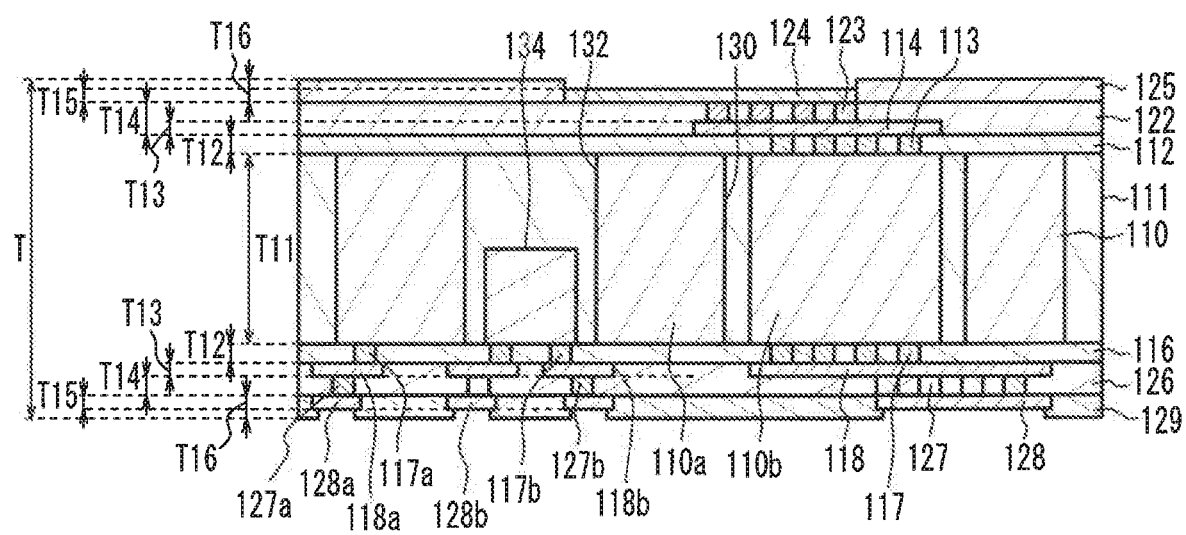
FIG. 16B is a cross-sectional view taken along line A-A in FIG. 16A.

FIG. 16A is a plan view of a multilayer board in accordance with a second embodiment, and FIG. 16B is a cross-sectional view taken along fine A-A in FIG. 16A. FIG. 16A illustrates mainly a core layer 110, vias 113 and 117, and an electronic component 134.

As illustrated in FIG. 16A and FIG. 16B, in a multilayer board 200, the core layer 110 includes a main body 110a and an island portion 110b. Openings 130 and 132 are formed in the main body 110a. The island portion 110b is located within the opening 130. The main body 110a and the island portion 110b are insulated from each other. The electronic component 134 is embedded in the opening 132. An insulating layer 111 is embedded in the openings 130 and 132.

An insulating layer 112 is located on the core layer 110, and a metal layer 114 is located on the insulating layer 112. An insulating layer 122 is located on the metal layer 114 and the insulating layer 112, and a metal layer 124 is located on the insulating layer 122. The vias 113 penetrate through the insulating layer 112, and electrically connect the island portion 110b and the metal layer 114. Vias 123 penetrate through the insulating layer 122, and electrically connect the metal layers 114 and 124. An insulating layer 125 having an opening above the metal layer 124 is located on the insulating layer 122.

An insulating layer 116 is located under the core layer 110, and metal layers 118, 118a and 118b are located under the insulating layer 116. An insulating layer 126 is located under the metal layers 118, 118a, and 118b and the insulating layer 116. Metal layers 128, 128a and 128b are located under the insulating layer 126. Vias 117, 117a, and 117b penetrate through the insulating layer 116, and vias 127, 127a and 127b penetrate through the insulating layer 126. The vias 117 electrically connect the metal layer 118 and the island portion 110b. The vias 127 electrically connect the metal layer 118 and the metal layer 128.

The metal layer 128a is electrically connected to the main body 110a through the via 127a, the metal layer 118a, and the via 117a. When a ground potential is supplied to the metal layer 128a, the main body 110a is grounded. The metal layer 128b is electrically connected to the electronic component 134 through the via 127b, the metal layer 118b, and the via 117b. The metal layers 128, 128a, and 128b function as terminals such as, but not limited to, lands. An insulating layer 129 having an opening under the metal layers 128, 128a, and 128b are located under the insulating layer 126.

The core layer 110 is a metal layer made of, for example, copper, a copper alloy, iron, or an iron alloy. The insulating layers 111, 112, 116, 122, and 126 are made of, for example, a synthesis resin, and is made of an epoxy resin, a bismaleimide triazine resin, or a polyimide resin. The synthesis resin may be mixed with a filler such as, but not limited to, a glass fiber. The insulating layers 125 and 129 are made of solder resist such as, but not limited to, an epoxy resin. The metal layers 114, 118, 118a, 118b, 124, 128, 128a, and 128b and the vias 113, 117, 117a, 117b, 123, 127, 127a, and 127b are metal layers mainly composed of, for example, copper, gold, or silver, and may include a barrier layer and/ or an adhesion layer. The electronic component 134 may be a chip component such as, but not limited to, a chip capacitor, a chip inductor, or a chip resistor, or may be a semiconductor device such as, but not limited to, an integrated circuit or a transistor. The semiconductor device may be a bare chip or a package in which a bare chip is installed.

The thickness T11 of the core layer 110 is, as an example, 340 μm, and is, for example, 35 μm to 500 μm. The thickness of each of the insulating layers 112 and 116 (the height T12 of each of the vias 113 and 117) is, as an example, 34 μm, and is, for example, 5 μm to 100 μm. The thickness T13 of each of the metal layers 114 and 118 is, as an example, 23 μm, and is, for example, 5 μm to 100 μm. The thickness T14 of each of the insulating layers 122 and 126 is, as an example, 29 μm, and is, for example, 5 μm to 100 μm. The thickness 115 of each of the metal layers 124 and 128 is, as an example, 23 μm, and is, for example, 5 μm to 100 μm. The thickness T16 of each of the insulating layers 125 and 129 is, as an example, 15 μm, and is, for example, 2 μm to 50 μm. The thickness T of the multilayer board 200 is, as an example, 588 μm.

A case where the metal layers 114 and 118 are electrically connected through a through-hole 138, as a third comparative example, and a case where the metal layers 114 and 118 are electrically connected through the island portion 110b as in the second embodiment were simulated.

Figure 17A:
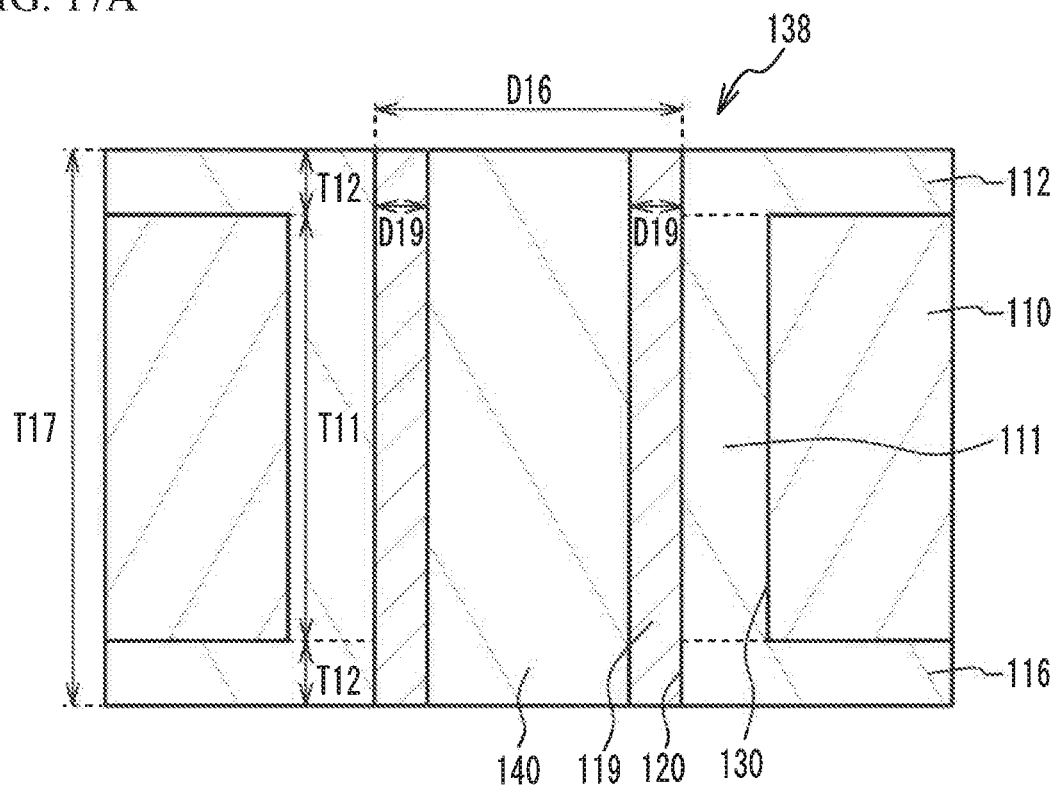
FIG. 17A and FIG. 17B are cross-sectional views in a third comparative example and the second embodiment, respectively.
Figure 17B:
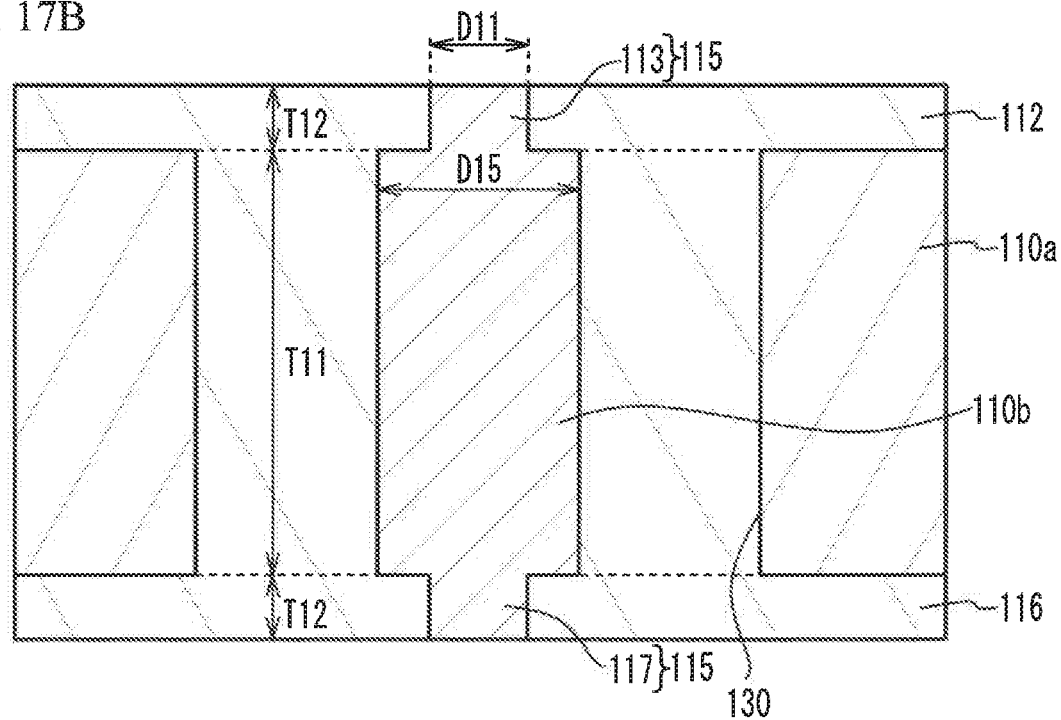
Figure 18A:
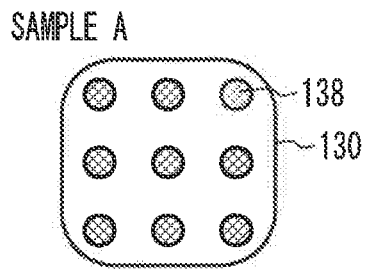
FIG. 18A to FIG. 18H are plan views of an opening 130 in the third comparative example and the second embodiment.
Figure 18B:
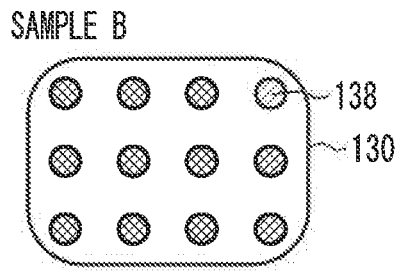
Figure 18C:
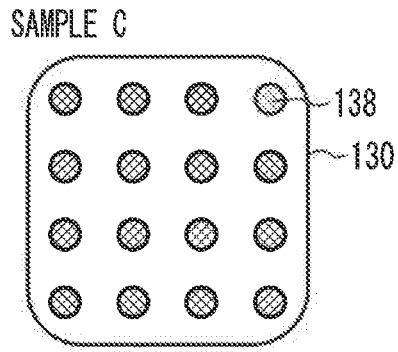
Figure 18D:
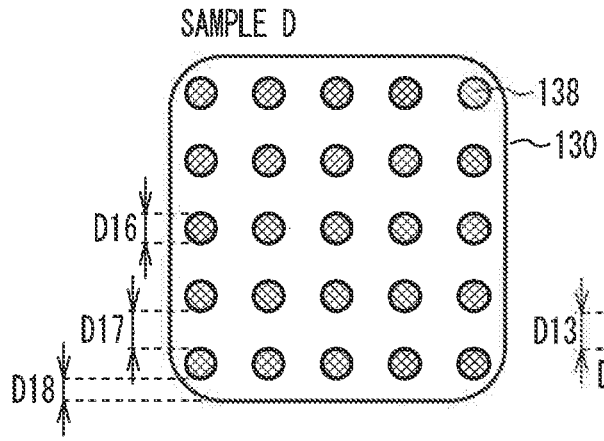
Figure 18E:
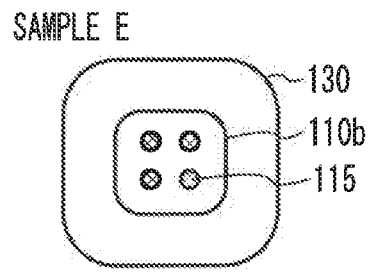
Figure 18F:
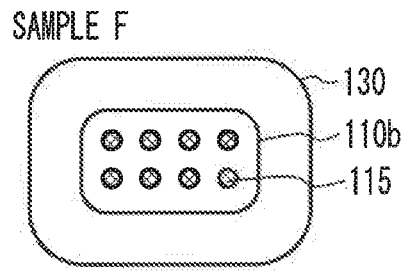
Figure 18G:
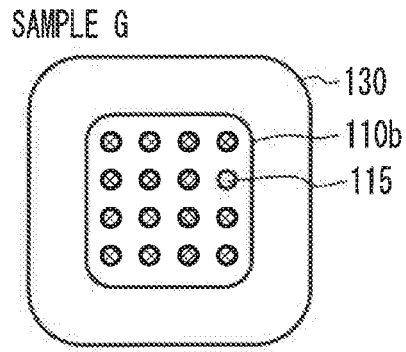
Figure 18H:
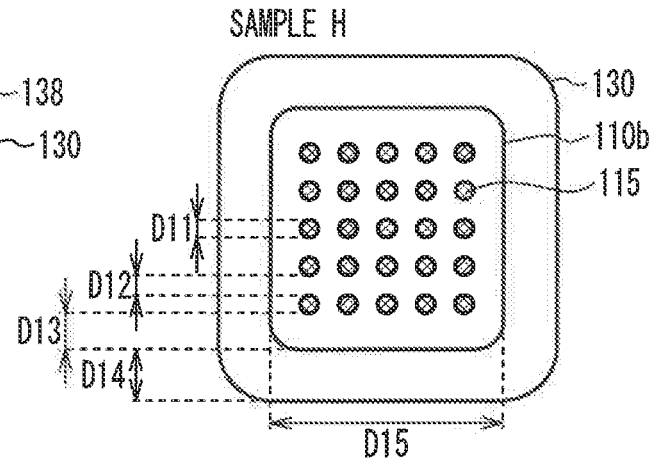

FIG. 17A and FIG. 17B are cross-sectional views in the third comparative example and the second embodiment, respectively, As illustrated in FIG. 17A, in the through-hole 138 of the third comparative example, an opening 120 is formed in the insulating layers 111, 112, and 116 within the opening 130. A metal layer 119 is formed on the inner surface of the opening 120. An insulating layer 140 is located within the metal layer 119. The height T17 of the through-hole 138 is T11+2×T12. The diameter of the through-hole 138 is assumed to be D16, and the thickness of the metal layer 119 is assumed to be D19.

As illustrated in FIG. 17B, in the second embodiment, the via 113 is located, as a pillar 115, on the island portion 110b, and the via 117 is located, as the pillar 115, under the island portion 110b. The height T12 of the pillar 115 is the thickness of each of the insulating layers 112 and 116. The diameter of the pillar 115 is assumed to be D11, and the width of the island portion 110b is assumed to be D15.

FIG. 18A to FIG. 18H are plan views of the opening 130 in the third comparative example and the second embodiment. FIG. 18A to FIG. 18D are plan views of the opening 130 in samples A to D of the third comparative example, respectively. FIG. 18E to FIG. 18H are plan views of the opening 130 in samples E to H of the second embodiment, respectively. The area of the opening 130 is substantially the same between the samples A and E. The area of the opening 130 is substantially the same between the samples B and F, the area of the opening 130 is substantially the same between the samples C and G, and the area of the opening 130 is substantially the same between the samples D and H. The areas of the openings 130 of the samples B and F are greater than those of the samples A and E, the areas of the openings 130 of the samples C and G are greater than those of the samples B and F, and the areas of the openings 130 of the samples D and H are greater than those of the samples C and G.

In the sample A, 3×3 through-holes 138 are provided. In the sample B, 4×3 through-holes 138 are provided. In the sample C, 4×4 through-holes 138 are provided. In the sample D, 5×5 through-holes 138 are provided.

In the sample E, 2×2 pillars 115 are provided. In the sample F, 4×2 pillars 115 are provided. In the sample G, 4×4 pillars 115 are provided. In the sample H, 5×5 pillars 115 are provided.

The diameter D16 of the through-hole 138 is the same among the samples A to D, the distance D17 between the edges of the through-holes 138 is the same among the samples A to D, and the distance D18 between the edge of the through-hole 138 and the edge of the opening 130 is the same among the samples A to D. The diameter D11 of the pillar 115 is the same among the samples E to H, the distance D12 between the edges of the pillars 115 is the same among the samples E to H, the distance D13 between the edge of the pillar 115 and the edge of the island portion 110b is the same among the samples E to H, and the distance D14 between the edge of the island portion 110b and the edge of the opening 130 is the same among the samples E to H.

In the third comparative example and the second embodiment, the resistance between the metal layers 114 and 118 with respect to the area of the opening 130 was simulated. Simulation conditions are as follows.

Materials of the core layer 110 and the metal layers 114 and 118: Copper

Thickness T11 of the core layer 110: 340 μm

Second embodiment

Height T12 of the pillar 115: 68 μm, 34 μm
Diameter D11 of the pillar 115: 50 μm
Distance D12 between the edges of the pillars 115: 100 μm
Distance D13 between the edge of the pillar 115 and the edge of the island portion 110b: 75 μm
Distance D14 between the edge of the island portion 110b and the edge of the opening 130: 200 μm In the sample in which the height T12 of the pillar 115 is 68 μm, T11:T12 is 5:1. In the sample in which T12 is 34 μm, T11:T12 is 10:1

Third Comparative Example

Figure 19:
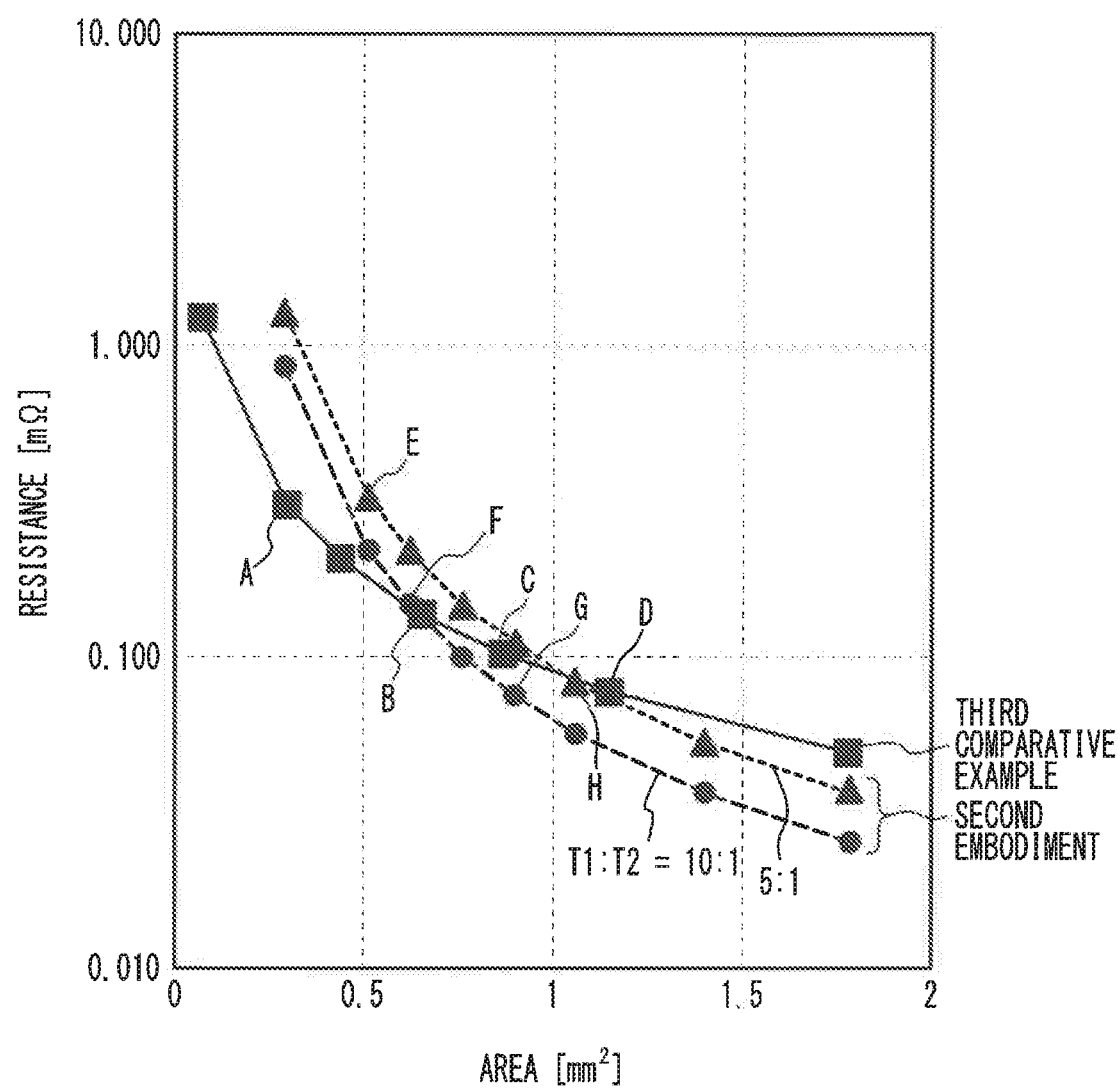
FIG. 19 is a graph of an electrical resistance between metal layers 114 and 118 versus the area of the opening 130 in the third comparative example and the second embodiment.

Height T17 of the through-hole 138: 454 μm
Diameter D16 of the through-hole 138: 110 μm
Distance D17 between the edges of the through-holes 138: 130 μm
Distance D18 between the edge of the through-hole 138 and the edge of the opening 130: 95 μm
Thickness D19 of the metal layer 119: 23 μm FIG. 19 is a graph of electrical resistance between the metal layers 114 and 118 versus the area of the opening 130 in the third comparative example and the second embodiment. Dots indicate the simulated points, and the line connects the dots. A to H indicate the dots of the samples A to H.

As presented in FIG. 19, as the area of the opening 130 is increased, the resistance decreases. When the area of the opening 130 is small, the resistance of the second embodiment is higher than that of the third comparative example. As the area of the opening 130 increases, the resistance of the second embodiment becomes smaller than that of the third comparative example. In the case of T11:T12=5:1, the resistance of the second embodiment becomes smaller than that of the third comparative example when the opening 130 becomes larger than those of the sample D and H. In the case of T11:T12=10:1, the resistance of the second embodiment becomes smaller than that of the third comparative example when the opening 130 becomes larger than those of the samples B and F.

As seen above, in the second embodiment, the electrical resistance between the metal layers 114 and 118 can be reduced by configuring the thickness T11 of the island portion 110b to be equal to or greater than five times the height T12 of the pillar 115. Thus, it becomes possible to cause a large current to flow between the metal layer above the core layer 110 to the metal layer under the core layer 110. In addition, the thermal resistance between the metal layers 114 and 118 can be reduced through the pillars 115 and the island portion 110b. This increases the heat release performance between the top and the bottom of the core layer 110. When the electrical resistance and the thermal resistance between the metal layers 114 and 118 are the same between the second embodiment and the third comparative example, the area of the opening 130 of the second embodiment can be made to be less than that of the third comparative example. Accordingly, the multilayer board 200 is reduced in size.

FIG. 20A to FIG. 21C are plan views of the island portion in the second embodiment. In the example of the FIG. 20A, the planar shape of the island portion 110*b* is a substantially square shape, and 10×10 pillars 115 are provided in the island portion 110*b*. The planar shape of the pillar 115 is a substantially circular shape. When the planar shape of the island portion 110*b* is a substantially square shape, the number of the pillars 115 per unit area of the island portion 110*b* can be made to be large. Provision of the larger number of the pillars 115 reduces the electrical resistance and the thermal resistance.

Figure 20A:
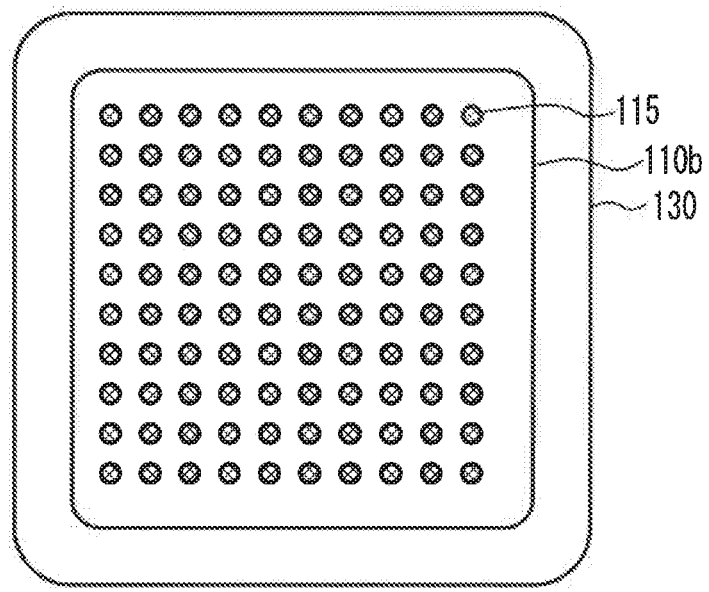
FIG. 20A to FIG. 20C are plan views of the island portion in the second embodiment.
Figure 20B:
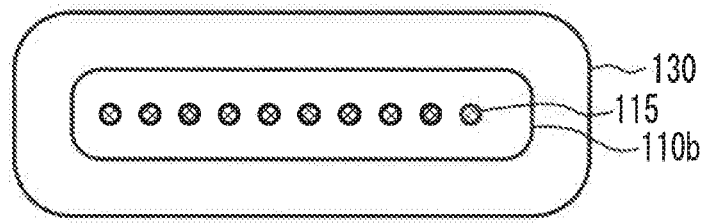
Figure 20C:
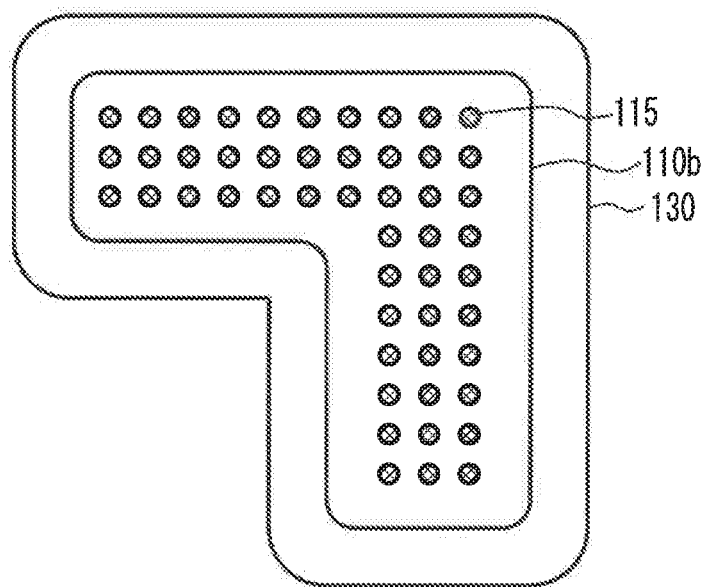

In the example of FIG. 20B, the planar shape of the island portion 110*b* is a substantially rectangle shape, and 10×1 pillars 115 are provided in the island portion 110*b*. In the example of FIG. 20C, the island portion 110*b* is L-shaped, and the pillars 115 are arranged in an L-shape. As illustrated in FIG. 20A to FIG. 20C, the planar shape of the island portion 110*b* can be freely selected, and thus, can be selected such that the multilayer board 200 is reduced in size.

Figure 21A:
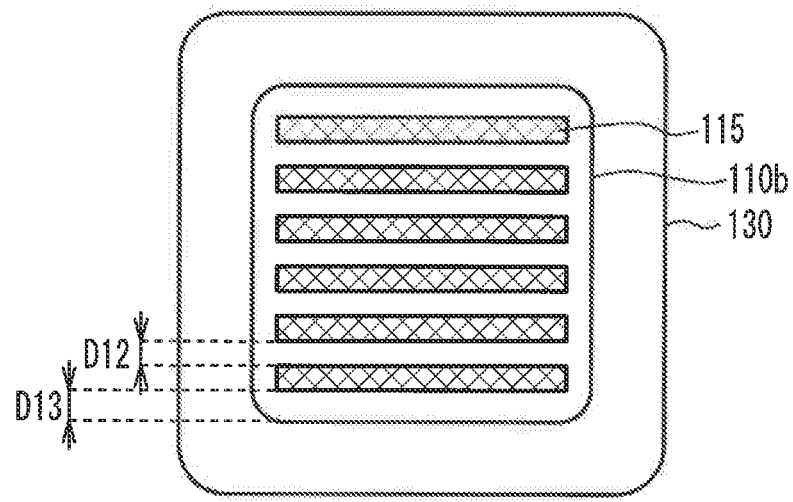
FIG. 21A to FIG. 21C are plan views of the island portion in the second embodiment.
Figure 21B:
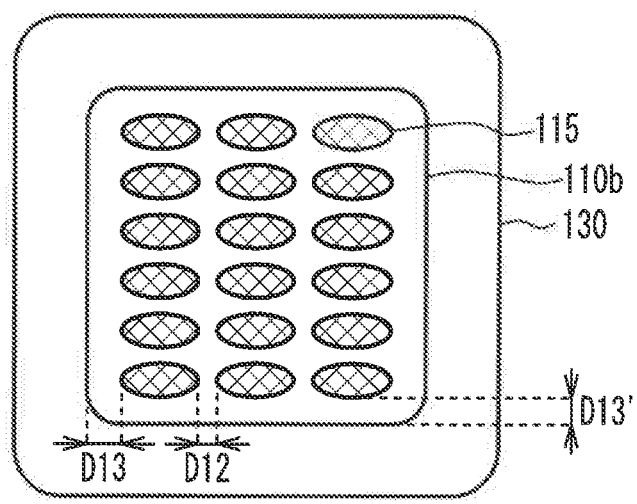

In the example of FIG. 21A, the planar shape of the pillar 115 is a substantially rectangular strip shape. In the example of FIG. 21B, the planar shape of the pillar 115 is an elliptical shape. As illustrated in FIG. 21A and FIG. 21B, the planar shape of the pillar 115 can be freely selected.

Figure 21C:
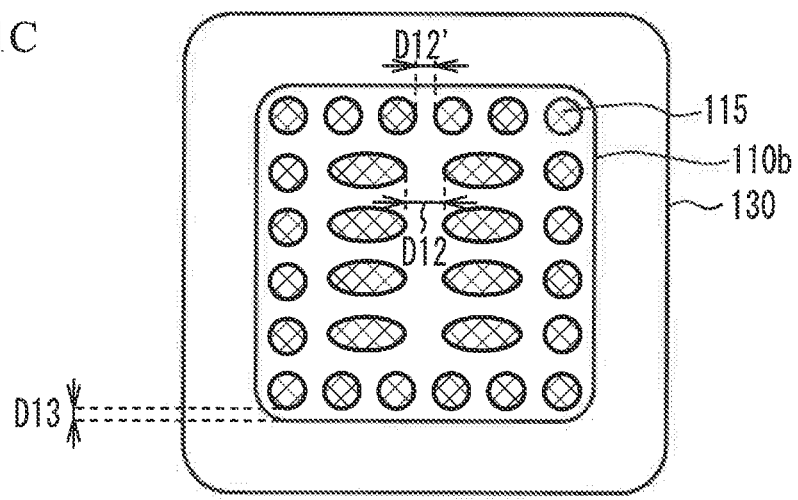

In the example of FIG. 21C, the pillars 115 having a circular planar shape and the pillars 115 having an elliptical planar shape are provided. As illustrated in FIG. 21C, the pillars 115 connected to the same island portion 110*b* may have different planar shapes. As illustrated in FIG. 20A and FIG. 20B, the pillars 115 have the same planar shape.

In the third comparative example, the metal layer 119 in the through-hole 138 is formed by plating or the like. Thus, it is difficult to make the metal layer 119 thick. Even though the diameter D16 of the through-hole 138 is increased, when the thickness D19 of the metal layer 119 is not changed, the volume of the metal layer 119 in the through-hole 138 does not become as large as the volume of the through-hole 138.

On the other hand, in the second embodiment, the core layer 110 (a metal core layer) is located between the metal layer 114 (a first metal layer) and the metal layer 118 (a second metal layer). The core layer 110 includes the main body 110*a* having the opening 130 (a first opening) formed therein, and the island portion 110*b* that is located in the main body 110*a* and is electrically separated from the main body 110*a*. The insulating layer 112 (a first insulating layer) and the insulating layer 116 (a second insulating layer) are sandwiched between the metal layers 114 and 118 and the core layer 110. The vias 113 (first metal vias) penetrate through the insulating layer 112, and connect the metal layer 114 and the island portion 110*b*. The vias 117 (second metal vias) penetrate through the insulating layer 116, and connect the metal layer 118 and the island portion 110*b*.

Since the island portion 110*b* is a part of the core layer 110, the thickness thereof is not limited unlike the thickness of the metal layer 119 of the third comparative example. Thus, the thicknesses (the heights T12) of the vias 113 and 117 are configured to be equal to or less than ⅕ of the thickness T11 of the island portion 110*b*. This configuration reduces the electrical resistance and the thermal resistance between the metal layers 114 and 118*e* compared with those of the third comparative example even when the area of the opening 130 is the same. Accordingly, the loss is reduced, and heat release performance is improved. The same electrical resistance and the same thermal resistance are achieved by the opening 130 smaller than that of the third comparative example. Thus, the multilayer board 200 can be reduced in size. The thicknesses of the main body 110*a* and the island portion 110*b* are substantially equal to each other, and are T11.

The thicknesses (the heights T12) of the vias 113 and 117 are preferably equal to or less then ⅐ of, more preferably equal to or less than ⅒ of the thickness T11 of the island portion 110*b*. As the island portion 110*b* thickens, the size of the multilayer board increases. Thus, the thicknesses (the heights T12) of the vias 113 and 117 are preferably equal to or greater than 1/50 of, more preferably equal to or greater than 1/20 of the thickness T11 of the island portion 110*b*. The thickness T11 of the island portion 110*b* is preferably equal to or greater than ⅓ of, more preferably equal to or greater than ½ of the thickness T of the multilayer board 200.

In FIG. 18E to FIG. 18H, FIG. 20A to FIG. 20C, and FIG. 21A to FIG. 21C, the sum of the areas of the pillars 115 (the sum of the areas of the surfaces connected to the island portion 110*b* of the vias 113 and 117) is preferably equal to or greater than 5% of, more preferably equal to or greater than 10% of the planar area of the island portion 110*b*. This configuration reduces the electrical resistance and the thermal resistance between the metal layers 114 and 118.

The width D15 of the island portion 110*b* is equal to or greater than the thickness T11 of the island portion 110*b*. This structure reduces the electrical resistance and the thermal resistance between the metal layers 114 and 118. When the planar shape of the island portion 110*b* is a substantially rectangle shape, the width of the shorter side is preferably equal to or greater than the thickness T11 of the island portion 110*b*. The width D15 of the island portion 110*b* is more preferably equal to or greater than two times the thickness T11, further preferably equal to or greater than five times the thickness T11.

The shortest distance D12 between the edges of the adjacent vias 113 is preferably equal to or greater than two times the thickness T11 of the island portion 110*b*, more preferably equal to or less than T11, further preferably equal to or less than ½ of T11. The shortest distance D12 between the edges of the adjacent vias 117 is preferably equal to or less than two times the thickness T11 of the island portion 110*b*, more preferably equal to or less than T11, further preferably equal to or less than ½ of T11. As illustrated in FIG. 21C, when the shortest distance D12' between the circular pillars 115 (i.e., the vias 113 and 117) is different from the shortest distance D12 between the elliptical pillars 115, the distance D12, which is the largest of the distances D12' and D12, is equal to or less than the thickness T11 of the core layer 110. This configuration makes the sum of the areas of the surfaces connected to the island portion 110*b* of the vias 113 and 117 large.

The shortest distance D13 between the edge of the outermost via 113 and the edge of the island portion 110*b* is preferably equal to or less than the thickness T11 of the island portion 110*b*, more preferably equal to or less than ½ of T11. The shortest distance D13 between the edge of the outermost via 117 and the edge of the island portion 110*b* is preferably equal to or less than the thickness T11 of the island portion 110*b*, more preferably equal to or less than ½ of T11. As illustrated in FIG. 21B, when the shortest distances D13' and D13 between the edges of the pillars 115 (i.e., the vias 113 and 117) and the edges of the island portion 110*b* are different, the distance D13, which is the largest of the distances D13' and D13, is equal to or less than the thickness T11 of the island portion 110*b*. This configuration makes the sum of the areas of the surfaces connected to the island portion 110*b* of the vias 113 and 117 large.

The number of the vias 113 connected to one island portion 110*b* is 10 or greater, and the number of the vias 117 connected to one island portion 110*b* is 10 or greater. This structure reduces the electrical resistance and the thermal resistance between the metal layers 114 and 118. The number of the vias 113 connected to one island portion 110*b* is preferably equal to or greater than 20, more preferably equal to or greater than 50. The number of the vias 117 connected to one island portion 110*b* is preferably equal to or greater than 20, more preferably equal to or greater than 50.

The vias 113 and 117 are arranged at constant intervals of the distance D12. This structure reduces the electrical resistance and thermal resistance between the metal layers 114 and 118.

The distance D14 between the edge of the island portion 110*b* and the edge of the opening 130 is preferably equal to or less than the thickness T11 of the island portion 110*b*, more preferably equal to or less than T11. This configuration reduces the area of the opening 130, and reduces the size of the multilayer board 200.

A ground potential is supplied to the main body 110*a*. In this case, when the island portion 110*b* comes in contact with the main body 110*a*, the pillars 115 are grounded. Thus, the island portion 110*b* is insulated from the main body 110*a*.

The electronic component 134 is embedded in the opening 132 (a second opening) formed in the main body 110*a*. The multilayer board in which the electronic component 134 is embedded can be reduced in size, but the thermal density of the multilayer board increases. Thus, it is effective to release heat through the island portion 110*b* and the pillars 115. Two or more electronic components 134 may be embedded in the main body 110*a*. Another electronic component may be mounted on the meted layer 124.

The through-hole 138 may be provided in the multilayer board 200. The area of the multilayer board 200 can be reduced by using the through-hole 138 for a pathway through which a small current passes.

Although the embodiments of the present invention have been described in detail, it is to be understood that the various change, substitutions, and alterations could be made hereto without departing from the spirit and scope of the invention.

What is claimed is:

1. A manufacturing method of a multilayer board comprising:
    forming a metal core layer including a main body, an island portion, and four connection portions, the island portion having a substantially rectangle shape and being located in an opening formed in the main body, the opening having a substantially rectangle shape, the four connection portions connecting side surfaces of four corners of the island portion or side surfaces of vicinities of the four corners of the island portion to a side surface of the main body;
    forming a first insulating layer on the metal core layer and in the opening; and
    forming, in the first insulating layer, a hole reaching each of the four connection portions and removing at least a part of each of the four connection portions through the hole to electrically separate the main body and the island portion from each other.

2. The manufacturing method according to claim 1, further comprising:
    forming a second insulating layer in a region where the at least a part of the connection portion is removed.

3. The manufacturing method according to claim 1, further comprising:
    forming a third insulating layer under the metal core layer;
    forming a first metal layer located on the first insulating layer and connected to the island portion through first metal pillars; and
    forming a second metal layer located under he third insulating layer and connected to the island portion through second metal pillars.

4. The manufacturing method according to claim 1, wherein
    the removing of the at least a part of each of the four connection portions includes making an angle of the side surface of the island portion an obtuse angle.

5. A multilayer board comprising:
    a metal core layer including a main body and an island portion, the island portion having a substantially rectangle shape, being located in an opening, and being electrically separated from the main body, the opening having a substantially rectangle shape and being formed in the main body;
    a first insulating layer located on the metal core layer and in the opening, the first insulating layer having four holes formed in four regions of the first insulating layer, a side surface of the main body and a side surface of the island portion being exposed to the four holes, the four holes reaching a surface of the first insulating layer, the four regions being located between four corners of the island portion or vicinities of the four corners of the island portion and four vertices of the opening or vicinities of the four vertices of the opening; and
    a second insulating layer filling the four holes.

6. The multilayer board according to claim 5, wherein
    at least one of the main body and the island portion includes protrusion portions of which side surfaces are exposed to the four holes.

7. The multilayer board according to claim 5, wherein
    an angle of the side surface of the island portion is an obtuse angle.

8. The multilayer board according to claim 6, wherein
    a region of a side surface exposed to each of the four holes of the metal core layer is flatter than a remaining surface of the metal core layer.

9. The multilayer board according to claim 5, further comprising:
    a third insulating layer located under the metal core layer;
    a first metal layer located on the first insulating layer and connected to the island portion through first metal pillars; and
    a second metal layer located under the third insulating layer and connected to the island portion through second metal pillars.

10. A multilayer board comprising:
    a metal core layer including a main body and an island portion, the island portion having a substantially rectangle shape, being located in an opening, and being electrically separated from the main body, the opening having a substantially rectangle shape and being located from a front surface to a back surface of the main body;
    protrusion portions located on the metal core layer and in the opening, the protrusion portions being traces of connection portions connecting the main body and the island portion, the protrusion portions being located in four regions between four corners of the island portion or vicinities of the four corners and four corners of the opening or vicinities of the four corners of the opening; and a first insulating layer filling a region defined by a side surface of the main body, a side surface of the island portion, and a side surface of the protrusion portion.

11. The multilayer board according to claim 10, further comprising:
- a second insulating layer located on the island portion;
- a first metal layer located on the second insulating layer;
- first metal pillars penetrating through the second insulating layer and mechanically connecting the island portion and the first metal layer;
- a third insulating layer located under the island portion;
- a second metal layer located under the third insulating layer; and
- second metal pillars penetrating through the third insulating layer and mechanically connecting the island portion and the second metal layer.

* * * * *